United States Patent
Keller et al.

(10) Patent No.: US 10,892,383 B2
(45) Date of Patent: Jan. 12, 2021

(54) LIGHT EMITTING DIODE PACKAGE AND METHOD FOR FABRICATING SAME

(71) Applicant: CREE, INC., Durham, NC (US)

(72) Inventors: Bernd Keller, Santa Barbara, CA (US); Thomas Cheng-Hsin Yuan, Ventura, CA (US); Nicholas W Medendorp, Jr., Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/705,228

(22) Filed: May 6, 2015

(65) Prior Publication Data

US 2015/0236219 A1 Aug. 20, 2015

Related U.S. Application Data

(62) Division of application No. 11/982,275, filed on Oct. 31, 2007, now Pat. No. 9,070,850.

(51) Int. Cl.
*H01L 33/48* (2010.01)
*H01L 33/64* (2010.01)
(Continued)

(52) U.S. Cl.
CPC ............. *H01L 33/486* (2013.01); *H01L 33/58* (2013.01); *H01L 33/62* (2013.01); *H01L 33/64* (2013.01);
(Continued)

(58) Field of Classification Search
CPC .......................................... H01L 33/0004–648
See application file for complete search history.

(56) References Cited

U.S. PATENT DOCUMENTS

| 3,760,237 A | 9/1973 | Jaffe .............................. 257/98 |
| 4,152,044 A | 5/1979 | Liu |

(Continued)

FOREIGN PATENT DOCUMENTS

| CN | 1274906 A | 11/2000 |
| CN | 2549313   | 5/2003 |

(Continued)

OTHER PUBLICATIONS

U.S. Appl. No. 11/613,692, filed Dec. 20, 2006.
(Continued)

*Primary Examiner* — Cuong B Nguyen
(74) *Attorney, Agent, or Firm* — Ferguson Case Orr Paterson LLP

(57) ABSTRACT

An LED package comprising a submount having a top and bottom surface with a plurality of top electrically and thermally conductive elements on its top surface. An LED is included on one of the top elements such that an electrical signal applied to the top elements causes the LED to emit light. The electrically conductive elements also spread heat from the LED across the majority of the submount top surface. A bottom thermally conductive element is included on the bottom surface of said submount and spreads heat from the submount, and a lens is formed directly over the LED. A method for fabricating LED packages comprising providing a submount panel sized to be separated into a plurality of LED package submounts. Top conductive elements are formed on one surface of the submount panel for a plurality of LED packages, and LEDs are attached to the top elements. Lenses are molded over the LEDs and the substrate panel is singulated to separate it into a plurality of LED packages.

11 Claims, 9 Drawing Sheets

(51) Int. Cl.
*H01L 33/62* (2010.01)
*H01L 33/58* (2010.01)
*H01L 33/54* (2010.01)

(52) U.S. Cl.
CPC ............ *H01L 33/54* (2013.01); *H01L 33/647* (2013.01); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2924/01019* (2013.01); *H01L 2924/01087* (2013.01); *H01L 2933/0025* (2013.01); *H01L 2933/0033* (2013.01); *H01L 2933/0058* (2013.01)

(56) References Cited

U.S. PATENT DOCUMENTS

| | | | |
|---|---|---|---|
| 4,307,297 A | 12/1981 | Groff | |
| 4,322,735 A | 3/1982 | Shibawra et al. | |
| 4,511,425 A | 4/1985 | Boyd | 156/493 |
| 4,675,575 A | 6/1987 | Smith et al. | |
| 4,946,547 A | 8/1990 | Palmour et al. | 156/643 |
| 4,972,089 A | 11/1990 | Stevenson | |
| 5,040,868 A | 8/1991 | Waitl | |
| 5,042,048 A | 8/1991 | Meyer | 372/108 |
| 5,122,943 A | 6/1992 | Pugh | 362/256 |
| 5,130,761 A | 7/1992 | Toshiaki | 357/17 |
| 5,167,556 A | 12/1992 | Stein | |
| 5,200,022 A | 4/1993 | Kong et al. | 156/612 |
| 5,351,106 A | 9/1994 | Lesko | 355/83 |
| RE34,861 E | 2/1995 | Davis et al. | 437/100 |
| 5,477,436 A | 12/1995 | Bertling et al. | |
| 5,703,401 A | 12/1997 | Van De Water | |
| 5,706,177 A | 1/1998 | Nather | |
| 5,790,298 A | 8/1998 | Tonar | 359/267 |
| 5,813,753 A | 9/1998 | Vriens et al. | 362/293 |
| 5,907,151 A | 5/1999 | Gramann | |
| 5,942,770 A | 8/1999 | Ishinaga et al. | 257/89 |
| 5,959,316 A | 9/1999 | Lowery | 257/98 |
| 6,061,160 A | 5/2000 | Maruyama | 359/152 |
| 6,066,861 A | 5/2000 | Hohn et al. | |
| 6,183,100 B1 | 2/2001 | Suckow et al. | 362/35 |
| 6,224,216 B1 | 5/2001 | Parker et al. | 353/31 |
| 6,259,608 B1 | 7/2001 | Berardinelli et al. | |
| 6,274,924 B1 | 8/2001 | Carey et al. | 257/676 |
| 6,296,367 B1 | 10/2001 | Parsons et al. | 362/183 |
| 6,330,111 B1 | 12/2001 | Myers | |
| 6,331,915 B1 | 12/2001 | Myers | |
| 6,345,903 B1 * | 2/2002 | Koike | H01L 33/486 257/E33.059 |
| 6,359,236 B1 | 3/2002 | Distefano et al. | |
| 6,376,902 B1 | 4/2002 | Arndt | 257/100 |
| 6,392,294 B1 | 5/2002 | Yamaguchi | |
| 6,447,124 B1 | 9/2002 | Fletcher et al. | 359/604 |
| 6,454,437 B1 | 9/2002 | Kelly | 362/246 |
| 6,469,321 B2 | 10/2002 | Arndt | |
| 6,480,389 B1 | 11/2002 | Shie et al. | 361/707 |
| 6,517,218 B2 | 2/2003 | Hochstein | 362/294 |
| 6,536,913 B1 | 3/2003 | Yajima et al. | 362/231 |
| 6,573,580 B2 | 6/2003 | Arndt | |
| 6,610,563 B1 | 8/2003 | Waitl | |
| 6,614,058 B2 | 9/2003 | Lin et al. | |
| 6,621,210 B2 | 9/2003 | Kato et al. | 313/496 |
| 6,624,491 B2 | 9/2003 | Waitl et al. | |
| 6,657,393 B2 | 12/2003 | Natsume | |
| 6,680,490 B2 | 1/2004 | Yasukawa et al. | |
| 6,686,609 B1 | 2/2004 | Sung | |
| 6,700,136 B2 | 3/2004 | Guida | 257/79 |
| 6,707,069 B2 | 3/2004 | Song et al. | 257/79 |
| 6,710,373 B2 | 3/2004 | Wang | |
| 6,717,353 B1 | 4/2004 | Mueller et al. | 313/501 |
| 6,746,889 B1 | 6/2004 | Eliashevich et al. | |
| 6,759,733 B2 | 7/2004 | Arndt | 257/672 |
| 6,765,235 B2 | 7/2004 | Fujiwara et al. | 257/88 |
| 6,770,498 B2 | 8/2004 | Hsu | 438/26 |
| 6,774,401 B2 | 8/2004 | Nakada et al. | |
| 6,784,463 B2 | 8/2004 | Camras et al. | |
| 6,858,879 B2 | 2/2005 | Waitl et al. | 257/99 |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,914,268 B2 | 7/2005 | Shei | 257/99 |
| 6,919,586 B2 | 7/2005 | Fujii | |
| 6,932,497 B1 | 8/2005 | Huang | |
| 6,940,704 B2 | 9/2005 | Stalions | |
| 6,946,714 B2 | 9/2005 | Waitl | |
| 6,964,877 B2 | 11/2005 | Chen et al. | 438/20 |
| 6,975,011 B2 | 12/2005 | Arndt | |
| 6,995,510 B2 | 2/2006 | Murakami | |
| D517,025 S | 3/2006 | Asakawa | D13/180 |
| 7,009,627 B2 | 3/2006 | Abe et al. | 345/690 |
| 7,021,797 B2 | 4/2006 | Minano et al. | 362/355 |
| 7,064,907 B2 | 6/2006 | Kaneko | |
| 7,066,626 B2 | 6/2006 | Omata | 362/257 |
| 7,087,936 B2 | 8/2006 | Negley | |
| 7,102,213 B2 | 9/2006 | Sorg | |
| 7,119,422 B2 | 10/2006 | Chin | 257/666 |
| 7,161,189 B2 | 1/2007 | Wu | 57/98 |
| 7,187,009 B2 | 3/2007 | Fukasawa et al. | 257/98 |
| 7,224,000 B2 | 5/2007 | Aanegola et al. | 257/98 |
| 7,244,965 B2 | 7/2007 | Andrews et al. | 257/98 |
| 7,282,740 B2 | 10/2007 | Chikugawa et al. | 257/79 |
| 7,285,802 B2 | 10/2007 | Ouderkirk et al. | 257/98 |
| 7,286,926 B2 | 10/2007 | Gotoh et al. | |
| 7,303,315 B2 | 12/2007 | Ouderkirk et al. | 362/294 |
| D572,210 S | 7/2008 | Lee | D13/180 |
| D572,670 S | 7/2008 | Ono et al. | D13/180 |
| D576,574 S | 9/2008 | Kobayakawa | D13/180 |
| 7,429,757 B2 | 9/2008 | Oyama et al. | 257/675 |
| 7,579,628 B2 | 8/2009 | Inoguchi | 257/81 |
| 7,622,795 B2 | 11/2009 | Chiang | 257/675 |
| 7,635,915 B2 | 12/2009 | Xie et al. | 257/692 |
| 7,692,206 B2 | 4/2010 | Loh | 257/99 |
| 7,777,412 B2 | 8/2010 | Pang | 313/506 |
| 7,875,899 B2 | 1/2011 | Yasuda | 257/99 |
| 7,923,831 B2 | 4/2011 | Ng | 257/692 |
| 7,932,111 B2 | 4/2011 | Edmond | |
| 7,939,848 B2 | 5/2011 | Kim | |
| 8,217,414 B2 | 7/2012 | Hayashi | 257/99 |
| 2002/0015013 A1 | 2/2002 | Ragle | |
| 2002/0054495 A1 | 5/2002 | Natsume | |
| 2002/0061174 A1 | 5/2002 | Hurt et al. | |
| 2002/0066905 A1 | 6/2002 | Wang | |
| 2002/0123163 A1 | 9/2002 | Fujii | |
| 2002/0123164 A1 | 9/2002 | Slater, Jr. | |
| 2002/0156187 A1 | 10/2002 | Greene | |
| 2002/0163001 A1 | 11/2002 | Shaddock | |
| 2002/0171087 A1 | 11/2002 | Krames et al. | |
| 2002/0171911 A1 | 11/2002 | Maegawa | |
| 2002/0195935 A1 | 12/2002 | Jager | |
| 2003/0015708 A1 | 1/2003 | Parikh et al. | |
| 2003/0116769 A1 | 6/2003 | Song et al. | |
| 2003/0121511 A1 | 7/2003 | Hashimura et al. | |
| 2003/0160256 A1 | 8/2003 | Durocher et al. | 257/88 |
| 2003/0183852 A1 | 10/2003 | Takenaka | |
| 2004/0016938 A1 | 1/2004 | Baretz et al. | 257/100 |
| 2004/0037076 A1 | 2/2004 | Katoh et al. | 362/235 |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0090174 A1 | 5/2004 | Tasch et al. | |
| 2004/0126913 A1 | 7/2004 | Loh et al. | |
| 2004/0207313 A1 | 10/2004 | Omoto et al. | |
| 2004/0207999 A1 | 10/2004 | Suehiro | |
| 2004/0227149 A1 | 11/2004 | Ibbetson | |
| 2004/0232435 A1 | 11/2004 | Hofer | |
| 2004/0238930 A1 | 12/2004 | Arndt | |
| 2005/0023548 A1 | 2/2005 | Bhat | |
| 2005/0072981 A1 | 4/2005 | Suenaga | 257/88 |
| 2005/0077535 A1 | 4/2005 | Van Hees et al. | |
| 2005/0082574 A1 | 4/2005 | Tasch et al. | |
| 2005/0093005 A1 | 5/2005 | Ruhnau | |

(56) References Cited

U.S. PATENT DOCUMENTS

| | | |
|---|---|---|
| 2005/0110033 A1 | 5/2005 | Heremans et al. ............ 257/98 |
| 2005/0117320 A1 | 6/2005 | Leu |
| 2005/0127377 A1 | 6/2005 | Arndt |
| 2005/0135105 A1 | 6/2005 | Teixeira et al. |
| 2005/0152127 A1 | 7/2005 | Kamiya et al. |
| 2005/0156187 A1 | 7/2005 | Isokawa |
| 2005/0173692 A1 | 8/2005 | Young et al. |
| 2005/0179376 A1 | 8/2005 | Fung et al. |
| 2005/0199899 A1 | 9/2005 | Lin et al. ........................ 257/99 |
| 2005/0231983 A1 | 10/2005 | Dahm .......................... 362/800 |
| 2005/0253130 A1 | 11/2005 | Tsutsumi et al. ............... 257/13 |
| 2006/0022212 A1 | 2/2006 | Waitl |
| 2006/0049477 A1 | 3/2006 | Arndt |
| 2006/0054912 A1 | 3/2006 | Murakami et al. |
| 2006/0060867 A1 | 3/2006 | Suehiro .......................... 257/81 |
| 2006/0081862 A1 | 4/2006 | Chua et al. |
| 2006/0091406 A1 | 5/2006 | Kaneko ........................... 257/81 |
| 2006/0102914 A1 | 5/2006 | Smits |
| 2006/0102917 A1 | 5/2006 | Oyama ........................... 257/99 |
| 2006/0105478 A1 | 5/2006 | Camras et al. ................ 438/22 |
| 2006/0105485 A1* | 5/2006 | Basin ..................... H01L 24/97 |
| | | 438/27 |
| 2006/0108594 A1 | 5/2006 | Iwasaki et al. |
| 2006/0131591 A1 | 6/2006 | Sumitani |
| 2006/0133044 A1 | 6/2006 | Kim et al. |
| 2006/0151809 A1 | 7/2006 | Isokawa |
| 2006/0157828 A1 | 7/2006 | Sorg |
| 2006/0158899 A1 | 7/2006 | Ayabe et al. |
| 2006/0180925 A1 | 8/2006 | Lee ............... 257/717 |
| 2006/0220046 A1 | 10/2006 | Yu et al. |
| 2006/0267031 A1 | 11/2006 | Tasch et al. |
| 2006/0267042 A1 | 11/2006 | Izuno et al. ................... 257/100 |
| 2006/0278882 A1 | 12/2006 | Leung et al. ................... 257/98 |
| 2006/0284207 A1* | 12/2006 | Park ........................ H01L 33/60 |
| | | 257/99 |
| 2006/0291185 A1 | 12/2006 | Atsushi .......................... 362/29 |
| 2007/0013090 A1* | 1/2007 | Takase ................... B29C 41/36 |
| | | 264/1.31 |
| 2007/0046176 A1 | 3/2007 | Bukesov et al. |
| 2007/0090383 A1 | 4/2007 | Ota et al. |
| 2007/0096139 A1 | 5/2007 | Schultz |
| 2007/0109779 A1 | 5/2007 | Sekiguchi et al. |
| 2007/0145401 A1 | 6/2007 | Ikehara |
| 2007/0170449 A1 | 7/2007 | Anandan |
| 2007/0205711 A1* | 9/2007 | Takashima .............. H01L 33/44 |
| | | 313/502 |
| 2007/0221928 A1* | 9/2007 | Lee ........................ H01L 33/486 |
| | | 257/79 |
| 2007/0241357 A1 | 10/2007 | Yan ................. 257/98 |
| 2007/0262328 A1 | 11/2007 | Bando |
| 2007/0269586 A1 | 11/2007 | Leatherdale |
| 2007/0294975 A1 | 12/2007 | Nadar et al. ..................... 52/483 |
| 2007/0295975 A1 | 12/2007 | Omae ............................. 257/89 |
| 2008/0013319 A1 | 1/2008 | Pei et al. |
| 2008/0026498 A1 | 1/2008 | Tarsa et al. ..................... 438/26 |
| 2008/0036364 A1 | 2/2008 | Li et al. |
| 2008/0041625 A1 | 2/2008 | Cheong |
| 2008/0074032 A1 | 3/2008 | Yano et al. |
| 2008/0093606 A1 | 4/2008 | Pan et al. |
| 2008/0121921 A1 | 5/2008 | Loh et al. |
| 2008/0149960 A1 | 6/2008 | Amo |
| 2008/0170391 A1 | 7/2008 | Norfidathul |
| 2008/0186702 A1 | 8/2008 | Camras et al. |
| 2008/0191232 A1 | 8/2008 | Lee et al. |
| 2008/0191610 A1 | 8/2008 | Oshio |
| 2008/0198594 A1 | 8/2008 | Lee |
| 2008/0230790 A1 | 9/2008 | Seko et al. |
| 2008/0239722 A1 | 10/2008 | Wilcox |
| 2008/0258156 A1 | 10/2008 | Hata ................. 257/88 |
| 2008/0258168 A1 | 10/2008 | Loh et al. |
| 2008/0296590 A1 | 12/2008 | Ng |
| 2008/0303052 A1 | 12/2008 | Lee et al. |
| 2009/0050907 A1 | 2/2009 | Yuan et al. |
| 2009/0050908 A1 | 2/2009 | Yuan et al. |
| 2009/0050924 A1 | 2/2009 | Edmond |
| 2009/0057708 A1 | 3/2009 | Abdul Karim et al. ....... 257/100 |
| 2009/0072251 A1 | 3/2009 | Chan et al. ..................... 257/89 |
| 2009/0095966 A1 | 4/2009 | Keller et al. ................... 257/98 |
| 2009/0108281 A1 | 4/2009 | Keller |
| 2009/0114937 A1* | 5/2009 | Kawakubo .............. B29C 70/70 |
| | | 257/98 |
| 2009/0129085 A1 | 5/2009 | Aizar ........................... 362/247 |
| 2009/0189178 A1 | 7/2009 | Kim et al. |
| 2009/0283781 A1 | 11/2009 | Chan et al. |
| 2009/0283787 A1 | 11/2009 | Donofrio |
| 2010/0044735 A1 | 2/2010 | Oyamada ........................ 257/98 |
| 2010/0103660 A1 | 4/2010 | Van de Ven et al. ......... 362/231 |
| 2010/0155763 A1 | 6/2010 | Donofrio |
| 2010/0193822 A1 | 8/2010 | Inobe et al. ..................... 257/98 |
| 2011/0049545 A1* | 3/2011 | Basin ..................... H01L 24/97 |
| | | 257/98 |
| 2011/0108874 A1 | 5/2011 | Chu ................. 257/98 |
| 2011/0121345 A1 | 5/2011 | Andrews et al. |
| 2011/0186880 A1 | 8/2011 | Kohler et al. .................. 257/91 |
| 2011/0193118 A1 | 8/2011 | Oshima et al. |
| 2011/0278617 A1 | 11/2011 | Lee |
| 2012/0146066 A1 | 6/2012 | Tischler |
| 2012/0235199 A1 | 9/2012 | Andrews et al. |
| 2012/0257386 A1 | 10/2012 | Harbers et al. ............... 362/235 |
| 2012/0268957 A1 | 10/2012 | Premysler |
| 2013/0056774 A1 | 3/2013 | Hong |
| 2013/0063024 A1 | 3/2013 | Wada ........................... 313/512 |
| 2013/0328074 A1 | 12/2013 | Lowes |
| 2013/0337591 A1 | 12/2013 | Chen ............................. 438/27 |
| 2014/0027795 A1 | 1/2014 | Reiherzer |
| 2014/0034986 A1 | 2/2014 | Bradley ........................... 257/98 |
| 2014/0175473 A1 | 6/2014 | Donofrio et al. |
| 2015/0137162 A1 | 5/2015 | Sabathil ........................ 257/98 |

FOREIGN PATENT DOCUMENTS

| | | |
|---|---|---|
| CN | 2617039 Y | 5/2004 |
| CN | 1581527 A | 2/2005 |
| CN | 1591924 A | 3/2005 |
| CN | 1679168 A | 10/2005 |
| CN | 1720608 A | 1/2006 |
| CN | 1744335 A | 3/2006 |
| CN | 1801498 A | 7/2006 |
| CN | 1874011 A | 12/2006 |
| CN | 1913135 A | 2/2007 |
| CN | 1977399 A | 6/2007 |
| CN | 101005109 A | 7/2007 |
| CN | 101013689 | 8/2007 |
| CN | 101061590 A | 10/2007 |
| CN | 101360368 | 2/2009 |
| CN | 101360368 A | 2/2009 |
| CN | 101611502 A | 12/2009 |
| DE | 202007012162 | 4/2008 |
| EP | 0684648 | 11/1995 |
| EP | 0936682 A | 8/1999 |
| EP | 1005085 A2 | 5/2000 |
| EP | 1187226 A1 | 3/2002 |
| EP | 1187227 | 3/2002 |
| EP | 1187228 | 3/2002 |
| EP | 1349202 A | 10/2003 |
| EP | 1418630 A1 | 5/2004 |
| EP | 1521313 | 4/2005 |
| EP | 1538680 A2 | 6/2005 |
| EP | 1653254 A2 | 5/2006 |
| EP | 1653255 | 5/2006 |
| EP | 1681509 | 7/2006 |
| EP | 1693904 | 8/2006 |
| EP | 1864780 | 12/2007 |
| EP | 1953834 A1 | 8/2008 |
| FR | 2586844 | 3/1987 |
| FR | 2759188 | 8/1998 |
| FR | 28142220 | 3/2002 |
| GB | 2420221 A | 12/2004 |
| GB | 2458972 A | 10/2009 |
| GB | 2466633 | 7/2010 |
| GB | 2466633 A | 7/2010 |
| JP | 53118019 | 10/1978 |
| JP | S53118019 | 10/1978 |

(56) References Cited

FOREIGN PATENT DOCUMENTS

| | | |
|---|---|---|
| JP | S53126570 | 10/1978 |
| JP | 59-27559 A | 2/1984 |
| JP | 5927559 A | 2/1984 |
| JP | 59027559 | 2/1984 |
| JP | 61-48951 A | 3/1986 |
| JP | 6148951 | 3/1986 |
| JP | 6148951 A | 3/1986 |
| JP | 61048951 | 3/1986 |
| JP | S62160564 | 3/1986 |
| JP | 62047156 | 2/1987 |
| JP | 62140758 | 9/1987 |
| JP | 038459 | 1/1991 |
| JP | 07202271 | 8/1995 |
| JP | 7202271 A | 8/1995 |
| JP | 07231120 | 8/1995 |
| JP | 08032120 | 2/1996 |
| JP | 61048951 | 3/1996 |
| JP | 8139257 | 5/1996 |
| JP | 10135492 | 5/1998 |
| JP | 10321909 | 12/1998 |
| JP | 11008405 | 1/1999 |
| JP | 11054802 | 2/1999 |
| JP | 11-167805 A | 6/1999 |
| JP | 11150306 | 6/1999 |
| JP | 11261113 | 9/1999 |
| JP | 2000188358 | 7/2000 |
| JP | 2000223751 | 8/2000 |
| JP | 2000223752 | 8/2000 |
| JP | 20000223751 | 8/2000 |
| JP | 2000261041 | 9/2000 |
| JP | 2001044506 | 2/2001 |
| JP | 2001050072 | 3/2001 |
| JP | 2001060072 | 3/2001 |
| JP | 2001168400 | 6/2001 |
| JP | 2001237463 | 8/2001 |
| JP | 2001518692 | 10/2001 |
| JP | 2002009217 | 1/2002 |
| JP | 2002223005 | 8/2002 |
| JP | 2002280479 A | 9/2002 |
| JP | 2002374005 | 12/2002 |
| JP | 2003007946 A | 1/2003 |
| JP | 2003197974 | 7/2003 |
| JP | 2003218405 | 7/2003 |
| JP | 2003264267 | 9/2003 |
| JP | 2003318449 | 11/2003 |
| JP | 2003324214 | 11/2003 |
| JP | 2004022862 | 1/2004 |
| JP | 2004056075 | 2/2004 |
| JP | 2004103775 | 2/2004 |
| JP | 2004507114 | 3/2004 |
| JP | 2004111937 A | 4/2004 |
| JP | 2004146815 | 5/2004 |
| JP | 2004200236 | 7/2004 |
| JP | 2004228387 | 8/2004 |
| JP | 2004327955 | 11/2004 |
| JP | 2004335740 | 11/2004 |
| JP | 2004335880 | 11/2004 |
| JP | 2004342870 | 12/2004 |
| JP | 2005-19838 A | 1/2005 |
| JP | 200519838 A | 1/2005 |
| JP | 2005019838 | 1/2005 |
| JP | 2005045199 | 2/2005 |
| JP | 2005079167 | 3/2005 |
| JP | 2005150624 | 6/2005 |
| JP | 2005223222 | 8/2005 |
| JP | 2005259754 | 9/2005 |
| JP | 2005259972 | 9/2005 |
| JP | 2005310935 | 11/2005 |
| JP | 2005347401 | 12/2005 |
| JP | 2005539386 | 12/2005 |
| JP | 2006019557 | 1/2006 |
| JP | 2006508537 | 3/2006 |
| JP | 2006509372 A | 3/2006 |
| JP | 2006108517 | 4/2006 |
| JP | 2006119357 | 5/2006 |
| JP | 2006179520 | 7/2006 |
| JP | 2006253689 | 9/2006 |
| JP | 2006-324331 | 11/2006 |
| JP | 2006324589 | 11/2006 |
| JP | 2006525679 | 11/2006 |
| JP | 2006332234 | 12/2006 |
| JP | 2006344692 | 12/2006 |
| JP | 2007094088 | 4/2007 |
| JP | 2007109836 | 4/2007 |
| JP | 2007509505 | 4/2007 |
| JP | 2007165029 | 6/2007 |
| JP | 2007165840 | 6/2007 |
| JP | 2007184542 | 7/2007 |
| JP | 2007243226 | 9/2007 |
| JP | 2007-273763 | 10/2007 |
| JP | 2007273763 | 10/2007 |
| JP | 2007281323 | 10/2007 |
| JP | 2007-287981 | 11/2007 |
| JP | 2007-299905 | 11/2007 |
| JP | 2007317896 | 12/2007 |
| JP | 2007329516 | 12/2007 |
| JP | 2008518461 | 5/2008 |
| JP | 2008521236 | 6/2008 |
| JP | H11054802 | 3/2011 |
| RU | 2251761 | 2/2005 |
| TW | 200616246 A | 5/2006 |
| WO | WO9856043 | 12/1998 |
| WO | WO9931737 | 6/1999 |
| WO | WO0211212 A | 2/2002 |
| WO | WO0217405 | 2/2002 |
| WO | 03044870 | 5/2003 |
| WO | WO03049204 | 6/2003 |
| WO | WO04027882 | 4/2004 |
| WO | WO200403660 | 4/2004 |
| WO | WO2004035660 | 4/2004 |
| WO | WO2004036660 | 4/2004 |
| WO | WO2004036660 A1 | 4/2004 |
| WO | WO04044877 | 5/2004 |
| WO | WO2004053933 A2 | 6/2004 |
| WO | WO05043627 A1 | 5/2005 |
| WO | WO05104247 | 11/2005 |
| WO | WO2006016398 | 2/2006 |
| WO | WO 2006/048064 A1 | 5/2006 |
| WO | WO06054228 A2 | 5/2006 |
| WO | WO06054228 A3 | 5/2006 |
| WO | WO2006046981 | 5/2006 |
| WO | WO2006054228 | 5/2006 |
| WO | WO2006054228 | 6/2006 |
| WO | WO2006135502 | 12/2006 |
| WO | WO07005844 A | 1/2007 |
| WO | WO2007121486 A2 | 10/2007 |
| WO | WO2007122516 | 11/2007 |
| WO | WO2007127029 A2 | 11/2007 |
| WO | WO2008081794 A1 | 7/2008 |
| WO | WO2008082098 | 7/2008 |
| WO | WO2010005294 | 1/2010 |
| WO | WO2012099145 A1 | 7/2012 |

OTHER PUBLICATIONS

U.S. Appl. No. 11/614,180, filed Dec. 21, 2006.
U.S. Appl. No. 11/624,811, filed Jan. 19, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.

(56) References Cited

OTHER PUBLICATIONS

U.S. Appl. No. 11/949,222, filed Dec. 3, 2007.
U.S. Appl. No. 12/174,053, filed Jul. 16, 2008.
U.S. Appl. No. 12/002,429, filed Dec. 4, 2007.
U.S. Appl. No. 12/045,729, filed Mar. 11, 2008.
U.S. Appl. No. 11/818,818, filed Jun. 14, 2007.
Office Action from Chinese Patent Appl. No. 201010167346.2, dated Oct. 12, 2015.
Appeal Decision from Japanese Patent Appl. No. 2008-281533, dated Oct. 13, 2015.
Second Office Action from Chinese Patent Appl. No. 201160051188.7, dated Nov. 3, 2015.
Reexamination Decision from Chinese Patent Appl. No. 200710152109.7, dated Nov. 26, 2015.
Second Office Action from Chinese Patent Appl. No. 2010106242824, dated Dec. 29, 2015.
Notice of Allowance from Taiwanese Patent Appl. No. 100131665, dated Dec. 15, 2015.
Office Action from U.S. Appl. No. 12/069,827, dated Nov. 12, 2015.
Office Action from U.S. Appl. No. 12/002,410, dated Nov. 30, 2015.
Notice of Allowance from Chinese Patent Appl. No. 201180051188.7, dated Feb. 3, 2016.
Decision of Rejection from Taiwanese Patent Appl. No. 100130234, dated Feb. 22, 2016.
Office Action from U.S. Appl. No. 12/875,873; dated Jan. 29, 2016.
Office Action from U.S. Appl. No. 14/329,807; dated Feb. 17, 2016.
Office Action from U.S. Appl. No. 12/069,827; dated Mar. 1, 2016.
Office Action from U.S. Appl. No. 13/652,241; dated Mar. 10, 2016.
Office Action from U.S. Appl. No. 14/478,571; dated Apr. 1, 2016.
Patent Certificate from Chinese Patent Appl. No. ZL2008800092557, dated Jul. 15, 2015.
Notice of Allowance from Taiwanese Patent Appl. No. 099113616, dated Sep. 2, 2015.
Office Action from U.S. Appl. No. 13/652,241, dated Sep. 11, 2015.
Office Action from U.S. Appl. No. 14/478,571, dated Oct. 1, 2015.
Notice of Issuance from Chinese Appl. No. 201210046248.2, dated Jun. 11, 2015.
First Office Action from Chinese Patent Appl. No. 2011800511887, dated Apr. 30, 2015.
Examination Report from Taiwanese appl. No. 100130234, dated Jun. 24, 2015.
Examination Report from Taiwanese Patent Appl. No. 100131665, dated Jul. 8, 2015.
International Preliminary Report on Patentability from appl. No. PCT/US2013/073921, dated Jun. 25, 2015.
Notice of Re-examination from Chinese Patent Appl. No. 200710152109.7, dated Jun. 9, 2015.
Pretrial Report from Japanese Appl. No. 2012-288000, dated May 19, 2015.
Fourth Office Action from Chinese Patent Appl. No. 201080027586.0, dated Jul. 29, 2015.
Office Action from U.S. Appl. No. 12/002,410, dated Jun. 17, 2015.
Response to OA from U.S. Appl. No. 12/002,410, filed Jun. 14, 2015.
Office Action from U.S. Appl. No. 12/069,827, dated Jun. 19, 2015.
Response to OA from U.S. Appl. No. 12/069,827, filed Aug. 19, 2015.
Office Action from U.S. Appl. No. 12/875,873, dated Jun. 29, 2015.
First Office Action for Chinese Patent Application No. 200780019643.9 dated Mar. 29, 2010.
Nichia Corp. White LED Part No. NSPW300BS, Specification for Nichia White LED , Model NSPW300BS., Jan. 14, 2004.
Nicha Corp., White LED Part No. NSPW312BS, Specification for Nichia White LED, Model NSPW312BS, Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp 649-651.

Declaration of Gerald Negley under 37 C.F R.§ 1.132, dated: Aug. 20, 2009.
Declaration of Charles Swoboda under 37 C.F.R.§ 1.132, dated: Aug. 19, 2009.
Preliminary Notice of Reasons for Refusal re related Japanese Application No. 2009-002857, dated Jul. 21, 2009.
Preliminary Notice of Reasons for Refusal re related Japanese Application No. 2009-002857, dated Apr. 24, 2009, pp. 1-2.
White Optics, LLC New Castle, DE "White 96 Advanced Coating", available on http://whiteoptics.com/whiteoptics-advanced-coatings/.
Cree® XLamp® XQ-B LED Product Family Data Sheet from www.cree,com/xlamp.
Cree® XLamp® XQ-D LED Product Family Data Sheet from www.cree.com/xlamp.
Direct Attach DA1000 LEDs Data Sheet CPR3ES Rev A from Cree. www.cree.com.
Direct Attach DA700 LEDs Data Sheet CPR3EU Rev from Cree, www.cree.com.
Direct Attach DA2432 LEDs Data Sheet CPR3FM Rev A from Cree, www.cree.com.
Direct Attach DA3547 LEDs Data Sheet CPR3EL Rev D from Cree, www.cree.com.
U.S. Appl. No. 11/473,089, filed Jun. 21, 2006, Tarse, et al.
U.S. Appl. No. 13/770,389, filed Feb. 19, 2013, Lowes, et al.
U.S. Appl. No. 13/759,229, filed Feb. 5, 2013, Hussell, et al.
U.S. Appl. No. 14/053,404, filed Oct. 14, 2013, Heikman, et al.
U.S. Appl. No. 13/369,996, filed Feb. 9, 2012, Donofrio.
U.S. Appl. No. 12/008,477, filed Jan. 11, 2008, Chitnis, et al.
U.S. Appl. No. 13/034,501, filed Mar. 24, 2011, Le, et al.
U.S. Appl. No. 13/028,946, filed Feb. 16, 2011, Le, et al.
U.S. Appl. No. 13/368,217, filed Feb. 17, 2012, Pickard, et al.
U.S. Appl. No. 12/837,303, filed Jul. 15, 2010, Edmond, et al.
Office Action in related U.S. Appl. No. 12/154,691, dated Dec. 17, 2009.
Response to OA in related U.S. Appl. No. 12/154,691, dated Dec. 17, 2009, Response filed: May 17, 2010.
Office Action in related U.S. Appl. No. 12/321,059, dated May 17, 2010.
Cree® XLAMP® MC-E LEDS Product Info Sheets, pp. 1-3.
Nichia Corporation LEDS, Models NSSM016G, NSSM227, NESM026X, NSSM026BB, NESM005A, 9 Pages.
Office Action in related U.S. Appl. No. 11/496,922, dated Jun. 10, 2010.
Office Action in related U.S. Appl. No. 11/496,922, dated Dec. 15, 2010.
Office Action in related U.S. Appl. No. 12/152,766, dated Oct. 7, 2010.
Office Action in related U.S. Appl. No. 12/152,766, dated Apr. 1, 2011.
Office Action in related U.S. Appl. No. 12/152,766, dated Mar. 12, 2010.
Office Action in related U.S. Appl. No. 11/465,120, dated Sep. 8, 2010.
Office Action in related U.S. Appl. No. 11/465,120, dated Dec. 13, 2010.
Office Action in related U.S. Appl. No. 11/465,120, dated Mar. 9, 2010.
Office Action in related U.S. Appl. No. 12/635,818, dated Oct. 14, 2010.
Office Action in related U.S. Appl. No. 12/695,978, dated Dec. 20, 2010.
Office Action in related U.S. Appl. No. 12/695,978, dated May 10, 2011.
Office Action in related U.S. Appl. No. 12/069,827, dated Oct. 29, 2010.
Office Action in related U.S. Appl. No. 12/069,827, dated Apr. 20, 2010.
Office Action in related U.S. Appl. No. 12/069,827, dated Jan. 27, 2011.
Office Action in related U.S. Appl. No. 12/002,410, dated Apr. 26, 2011.

(56) References Cited

OTHER PUBLICATIONS

Office Action in related U.S. Appl. No. 12/002,410, dated May 25, 2010.
Office Action in related U.S. Appl. No. 12/002,410, dated Dec. 13, 2010.
Office Action in related U.S. Appl. No. 11/149,998, dated May 11, 2011.
Office Action in related U.S. Appl. No. 11/149,998, dated Aug. 27, 2010.
Office Action in related U.S. Appl. No. 11/149,998, dated Jan. 24, 2011.
Office Action in related U.S. Appl. No. 11/149,998, dated Nov. 20, 2009.
Response to OA in related U.S. Appl. No. 11/149,998, dated Nov. 20, 2009, Response filed: Feb. 22, 2010.
Office Action in related U.S. Appl. No. 11/149,998, dated May 18, 2010.
Office Action in related U.S. Appl. No. 12/291,293, dated May 27, 2010.
Office Action in related U.S. Appl. No. 12/291,293, dated Sep. 3, 2010.
Office Action in related U.S. Appl. No. 12/291,293, dated Mar. 1, 2011.
International Preliminary Report on Patentability for PCT/CN2010/070073 dated Apr. 28, 2011.
International Search Report and Written Opinion for counterpart PCT Application No. PCT/CN2010/001865 dated Jun. 9, 2011.
Office Action from U.S. Appl. No. 12/291,293, dated Jul. 19, 2011.
Response to Office Action from U.S. Appl. No. 12/291,293, OA dated Jul. 19, 2011, Resp. dated: Oct. 19, 2011.
Office Action from U.S. Appl. No. 11/465,120, dated Jun. 14, 2011.
Office Action from U.S. Appl. No. 12/069,827, dated Jun. 16, 2011.
Response to Office Action from U.S. Appl. No. 12/069,827, OA dated Jul. 16, 2011, Resp. dated: Aug. 3, 2011.
Office Action from U.S. Appl. No. 12/321,059, dated Jun. 22, 2011.
Response to Office Action from U.S. Appl. No. 12/321,059, OA dated Jun. 22, 2011, Resp. dated: Aug. 22, 2011.
Office Action from U.S. Appl. No. 12/321,059, dated Aug. 26, 2011.
Response to Office Action from U.S. Appl. No. 12/321,059, OA dated Jun. 22, 2011, Resp. dated: Sep. 20, 2011.
Office Action from U.S. Appl. No. 11/496,922, dated Jul. 5, 2011.
Office Action from U.S. Appl. No. 12/695,978, dated Sep. 14, 2011.
Office Action from U.S. Appl. No. 11/149,996, dated Sep. 21, 2011.
Office Action from U.S. Appl. No. 12/321,059, dated Oct. 4, 2011.
Office Action from U.S. Appl. No. 12/069,827, dated Oct. 26, 2011.
Notice of Reasons for Rejection for Japanese Patent Appl. No. JP 2007-211901 dated Apr. 14, 2011.
Notice of Reasons for Rejection for Japanese Patent Appl. No. JP 2008-515699 dated May 19, 2011.
Notice of Reasons for Rejection for Japanese Patent Appl. No. JP 2008-281533 dated Jun. 24, 2011.
Notice of Reasons for Rejection for Japanese Patent Appl. No. JP 2009-507195 dated Jun. 10, 2011.
International Search Report and Written Opinion for PCT Appl. No. PCT/US2011/001457 dated Dec. 13, 2011.
Second Office Action for Chinese Patent Appl. No. CN 200880009255.7 dated Oct. 13, 2011.
Extended Supplementary European Search Report for EP Application No. EP07789665.2 dated Nov. 7, 2011.
US Published Application No. 2004/0079957 by Andrews. et al., dated: Apr. 29, 2004.
First Office Action for Chinese Patent Application No. CN 200710152109.7 dated Jul. 29, 2011.
Notification of the First Office Action from Chinese Patent Application No. 201010167346.2, dated Feb. 29, 2012.
Decision of Rejection for Japanese Patent Application No. 2007-211901, dated Jan. 30, 2012.
Notice of Reasons for Rejection from Japanese Patent Application No. 2009-507195, dated May 8, 2012.
First Office Action for Chinese Patent Application No. 200980153995.2, dated May 4, 2012.
First Office Action for Chinese Patent Application No. 200910145412.3, dated Apr. 28, 2012.
Office Action from U.S. Appl. No. 11/465,120, dated Dec. 9, 2011.
US Publication No. 2004/0256706, dated: Dec. 2004 to Nakashima, Shintaro.
Office Action from U.S. Appl. No. 12/002,410, dated Mar. 28, 2012.
Office Action from U.S. Appl. No. 12/002,410, dated Dec. 21, 2011.
US Publication No. 2008/0296590, dated: Dec. 2008, to Ng, Kee Yean.
Response to Office Action for U.S. Appl. No. 12/002,410, filed Mar. 8, 2012.
Office Action from U.S. Appl. No. 12/757,179, dated Jan. 19, 2012.
US Publication No. 2011/0049545, dated: Mar. 2011 to Basin et al.
Office Action from U.S. Appl. No. 11/496,922, dated Feb. 9, 2012.
Response to Office Action for U.S. Appl. No. 11/496,922, filed Apr. 6, 2012.
Advisory Action for U.S. Appl. No. 11/496,922, dated Apr. 18, 2012.
Office Action from U.S. Appl. No. 12/321,059, dated Feb. 10, 2012.
Response to Office Action for U.S. Appl. No. 12/321,059, filed Apr. 9, 2012.
Advisory Action from U.S. Appl. No. 12/321,059, dated Apr. 20, 2012.
Office Action from U.S. Appl. No. 12/695,978, dated Mar. 14, 2012.
Office Action from U.S. Appl. No. 12/614,989, dated Mar. 12, 2012.
Office Action from U.S. Appl. No. 12/069,827, dated Apr. 3, 2012.
First Office Action for Chinese Patent Application No. 201110039136.9, dated Jun. 4, 2012.
Decision of Rejection from Japanese Patent Application No. 2008-515699, dated Jul. 17, 2012.
Office Action from related U.S. Appl. No. 12/757,891, dated May 9, 2012.
Interrogation from Japanese Patent Application No. 2007-211901, dated Aug. 21, 2012.
Examination Report from European Patent Application No. 07789665.2, dated Aug. 20, 2012.
Decision of Rejection from Chinese Patent Application No. 200880009255.7, dated Sep. 5, 2012.
First Office Action from Chinese Patent Application No. 201080001658.4, dated Sep. 24, 2012.
Extended Search Report for European Patent Application No. 09824413.0-1551, dated Feb. 11, 2013.
Second Office Action from Chinese Patent Appl. No. 201110039138.9, dated Jan. 31, 2013.
International Search Report and Written Opinion from PCT application No. PC7/US2012/065060, dated Feb. 20, 2013.
Notice of Reasons for Rejection from Japanese Patent Appl. No. 2011-259253, dated May 28, 2013.
Decision of Rejection from Japanese Patent Appl. No. 2008-281533, dated May 28, 2013.
Decision of Rejection from Japanese Patent Application No. 2009-507195, dated May 21, 2013.
Communication from European Patent Appl. No. 09824413.0-1551, dated Feb. 28, 2013.
European Search Report from European Patent Appl. No. 09824413.0-1551, dated Feb. 11, 2013.
Notice of Reasons for Rejection from Japanese Patent Appl. No. 2011-534993, dated Mar. 12, 2013.
Notification of the Second Office Action from Chinese Patent Application No. 201010167346.2, dated Feb. 17, 2013.
Third Office Action from Chinese Patent Application No. 200710152109.7, dated Mar. 5, 2013.
Interrogation from Japanese Patent Application No. 2008-515699, dated Feb. 19, 2013.
Notice of Reasons for Rejection from Japanese Patent Application No. 2007-211901, dated Apr. 9, 2013.
Decision of Rejection from Japanese Patent Application No. 2011-545616, dated Apr. 26, 2013.
Office Action from U.S. Appl. No. 12/875,873, dated Feb. 21, 2013.
Response to OA from U.S. Appl. No. 12/875,873, filed Apr. 19, 2013.

(56) References Cited

OTHER PUBLICATIONS

Office Action from U.S. Appl. No. 12/291,293, dated Feb. 28, 2013.
Response to OA from U.S. Appl. No. 12/291,293, filed Jun. 5, 2013.
Office Action from U.S. Appl. No. 12/695,978, dated Apr. 18, 2313.
Response to OA from U.S. Appl. No. 12/695,978, filed Jul. 10, 2013.
Office Action from U.S. Appl. No. 12/757,179, dated Jul. 16, 2012.
Response to OA from U.S. Appl. No. 12/757,179, filed Sep. 25, 2012.
Office Action from U.S. Appl. No. 12/069,827, dated Dec. 6, 2012.
Response to OA from U.S. Appl. No. 12/069,827, filed Jan. 29, 2013.
Office Action from U.S. Appl. No. 11/496,922, dated Nov. 23, 2012.
Response to OA from U.S. Appl. No. 11/496,922, filed Apr. 23, 2013.
Office Action from U.S. Appl. No. 12/757,891, dated Nov. 28, 2012.
Response to OA from U.S. Appl. No. 12/757,891, filed Jan. 28, 2013.
Office Action from U.S. Appl. No. 13/306,589, dated Feb. 20, 2013.
Response to OA from U.S. Appl. No. 13/306,589, filed May 16, 2013.
Office Action from U.S. Appl. No. 12/002,410, dated Jan. 29, 2013.
Response to OA from U.S. Appl. No. 12/002,410, filed Apr. 18, 2013.
Office Action from U.S. Appl. No. 12/868,567, dated Feb. 22, 2013.
Response to OA from U.S. Appl. No. 12/868,567, filed May 21, 2013.
Office Action from U.S. Appl. No. 12/069,827, dated Mar. 5, 2013.
Response to OA from U.S. Appl. No. 12/069,827, filed Jun. 5, 2013.
Office Action from U.S. Appl. No. 11/149,998, filed Apr. 3, 2013.
Response to OA from U.S. Appl. No. 11/149,998, filed Jun. 25, 2013.
Office Action from U.S. Appl. No. 12/868,567, dated Sep. 12, 2012.
Response to OA from U.S. Appl. No. 12/868,567, filed Jan. 14, 2013.
Office Action from U.S. Appl. No. 12/002,410, dated Sep. 25, 2012.
Response to OA from U.S. Appl. No. 12/002,410, filed Dec. 18, 2012.
Office Action from U.S. Appl. No. 12/069,827, dated Aug. 9, 2012.
Response to OA from U.S. Appl. No. 12/069,827, filed Nov. 9, 2012.
Office Action from U.S. Appl. No. 11/465,120, dated Aug. 21, 2012.
Response to OA from U.S. Appl. No. 11/465,120, filed Aug. 24, 2012.
Office Action from U.S. Appl. No. 12/875,873, dated Aug. 22, 2012.
Response to OA from U.S. Appl. No. 12/875,873, filed Nov. 19, 2012.
Office Action from U.S. Appl. No. 11/465,120, dated Jun. 19, 2012.
Response to OA from U.S. Appl. No. 11/465,120, filed Aug. 15, 2012.
Office Action from U.S. Appl. No. 12/868,567, dated Jul. 5, 2013.
Office Action from U.S. Appl. No. 12/875,873, dated Jul. 3, 2013.
Office Action from U.S. Appl. No. 11/496,922, dated Jun. 26, 2013.
Office Action from U.S. Appl. No. 12/757,891, dated Jun. 18, 2013.
Decision of Rejection from Chinese Patent Appl. No. 201080001658.4, dated Jun. 20, 2013.
Office Action from U.S. Appl. No. 11/149,998, dated Jul. 26, 2013.
Office Action from U.S. Appl. No. 12/069,827, dated Jul. 3, 2013.
Office Action from U.S. Appl. No. 12/291,293, dated Aug. 20, 2013.
Fourth Office Action from Chinese Patent Appl. No. 200710152109.7, dated Jun. 28, 2013.
Appeal Decision from Japanese Patent Appl. No 2008-515699, dated Sep. 20, 2013.
Decision of Rejection from Chinese Patent Appl. No. 201001067346.2, dated Aug. 30, 2013.
Office Action from U.S. Appl. No. 12/695,978, dated Sep. 17, 2013.
Office Action from U.S. Appl. No. 13/652,241, dated Sep. 11, 2013.
Office Action from U.S. Appl. No. 12/002,410, dated Sep. 10, 2013.
Office Action from Japanese Patent Appl. No. 2012-288000, dated Oct. 8, 2013.

Decision of Rejection from Chinese Patent Appl. No. 201110039138.9 dated Sep. 25, 2013.
Office Action from U.S. Appl. No. 12/069,827, dated Oct. 25, 2013.
Office Action from U.S. Appl. No. 11/496,922, dated Oct. 9, 2013.
Office Action from U.S. Appl. No. 12/875,873, dated Oct. 18, 2013.
Notice of Reasons for Rejection from Japanese Patent Appl. No. 2007-211901, dated Oct. 8, 2013.
Notification of Loss of Rights from European Patent Appl. No. 09824413.0, dated Oct. 17, 2013.
Appeal board's Questioning from Japanese Patent Appl. No. 2011-545616, dated Nov. 12, 2013.
Search Report for European Patent Appl. No. 10731037.7, dated Dec. 11, 2013.
Notice of Reasons for Rejection from Japanese Patent Appl. No. 2011-534993, dated Nov. 12, 2013.
Fifth Office Action from Chinese Patent Appl. No. 2007/10152109.7, dated Jan, 6, 2014.
Supplemental European Search Report from European Patent Appl. No. 10731037.7, dated Jan. 9, 2014.
Office Action from U.S. Appl. No. 12/757,891, dated Jan. 14, 2014.
Office Action from U.S. Appl. No. 12/695,978, dated Jan. 31, 2014.
Office Action from U.S. Appl. No. 12/002,410, dated Feb. 4, 2014.
Interrogation from Japanese Patent Appl. No. 2009-507195, dated Jan. 28, 2014.
Notification of Designation of the Appeal Examiner from Japanese Patent Appl. No. 2009-507195, dated Jan. 22, 2014.
Interrogation from Japanese Patent Appl. No. 2008-281533, dated Jan. 21, 2014.
International Search Report and Written Opinion from PCT/US2013/073921, dated Feb. 18, 2014.
Decision of Registration from Japanese Design Appl. No. 2012-030304, dated Jan. 21, 2014.
Decision of Re-Examination from Chinese Patent Appl. No. 201110339138.9, dated Mar. 13, 2014.
First Office Action from Chinese Patent Appl. No. 201080027586.0, dated Feb. 8, 2014.
Office Action from U.S. Appl. No. 12/875,873, dated Feb. 25, 2014.
Office Action from U.S. Appl. No. 13/652,241, dated Mar. 12, 2014.
Office Action from U.S. Appl. No. 12/069,827, dated Apr. 1, 2014.
Office Action from Russian Patent Appl. No. 2011146934/28, dated Feb. 28, 2014.
Second Office Action from Chinese Patent Appl. No. 201210046248.2, dated Apr. 15, 2014.
Partial European Search Report from European Patent Appl. No. 08253519.6-1564, dated Apr. 29, 2014.
Decision of Rejection from Japanese Patent Appl No. 2011-259253, dated Mar. 25, 2014.
Office Action from U.S. Appl. No. 12/002,410, dated May 20, 2014.
Search Report from Chinese Patent Appl. No. 201210046248.2, dated Apr. 15, 2014.
International Preliminary Report on Patentability from PCT/US2012/065060, dated Jun. 12, 2014.
Notification of Reexamination from Chinese Patent Appl. No. 2008800092557, dated May 12, 2014.
Examination from European Patent Appl. No. 09 824 413.0-1551, dated May 16, 2014.
Decision on Rejection from Chinese Patent Appl. No. 2007101521097, dated Mar. 17, 2014.
Office Action from Japanese Patent Appl. No. 2008-81533, dated Jul. 22, 2014.
Decision on Appeal from Japanese Patent Appl. No. 2011-545616, dated Jun. 27, 2014.
Reason for Rejection from Japanese Patent Appl. No. 2009-507195, dated Jul. 15, 2014.
Notification of Allowance from Taiwan Appl. Patent No. 103202911, dated Jul. 16, 2014.
Third Office Action and Search Report from Chinese Patent Appl. No. 2011100391389, dated Jun. 23, 2014.
Office Action from U.S. Appl. No. 12/875,873, dated Jun. 25, 2014.
Response to OA from U.S. Appl. No. 12/875,873, filed Aug. 12, 2014.
Office Action from U.S. Appl. No. 12/069,827, dated Jul. 11, 2014.
Office Action from U.S. Appl. No. 12/695,978, dated Jul. 16, 2014.

(56) References Cited

OTHER PUBLICATIONS

Response to OA from U.S. Appl. No. 12/695,978, filed Aug. 11, 2014.
Extended European Search Report from European Patent Appl. No. 08253519.6, dated Aug. 13, 2014.
Notification of Reexamination from Chinese Appl. No. 2010800016584, dated Sep. 11, 2014.
Decision to Grant from Russian Patent Appl. No. 2011146934/28, dated Aug. 14, 2014.
Reasons for Rejection from Japanese Patent Appl. No. 2011-534993, dated Oct. 7, 2014.
Second Office Action from Chinese Patent Appl. No. 201180027586.0, dated Sep. 16, 2014.
Third Office Action from Chinese Patent Appl. No. 2012100462482, dated Oct. 10, 2014.
Decision of Re-Examination from Chinese Appl. No. 200880009255.7, dated Oct. 22, 2014.
Pretrial Report from Japanese Appl. No. 2011-259253, dated Sep. 30, 2014.
Decision of Rejection from Japanese Appl. No. 2012-288000, dated Oct. 28, 2014.
Fourth Office Action from Chinese Appl. No. 2011100391389, dated Nov. 24, 2014.
Decision of Patent Grant from Japanese Appl. No. 2011-534993, dated Dec. 24, 2014.
Office Action from U.S. Appl. No. 12/875,873, dated Oct. 3, 2014.
Office Action from U.S. Appl. No. 12/069,827, dated Oct. 28, 2014.
Office Action from U.S. Appl. No. 12/002,410, dated Nov. 4, 2014.
Office Action from U.S. Appl. No. 13/652,241, dated Nov. 19, 2014.
Notification of Reexamination from Chinese Appl. No. 2010101673462, dated Jan. 12, 2015.
Third Office Action from Chinese Appl. No. 2008800092557, dated Dec. 29, 2014.
Office Action from U.S. Appl. No. 12/069,827, dated Feb. 6, 2015.
Office Action from U.S. Appl. No. 12/002,410, dated Feb. 23, 2015.
Examination Report from EU Application No. 07 789 665.2, dated Jan. 21, 2015.
Third Office Action from Chinese Appl. No. 201080027586.0, dated Jan. 21, 2015.
Office Action from Taiwanese Appl. No. 099113616, dated Dec. 26, 2014.
Office Action from U.S. Appl. No. 12/875,873, dated Mar. 2, 2015.
Response from U.S. Appl. No. 12/875,873, filed Apr. 22, 2015.
Office Action from U.S. Appl. No. 13/652,241, dated Mar. 17, 2015.
Office Action from U.S. Appl. No. 13/804,309, dated Mar. 10, 2015.
Noting of loss of rights from European Patent Appl. No. 08253519.6-1558/2056363, dated Apr. 16, 2015.
Notice of Reasons for Rejection from Japanese Patent Appl. No. 2011-259253, dated Feb. 3, 2015.
Appeal Decision from Japanese Patent Appl. No. 2013-18375, dated Mar. 10, 2015.
Office Action from Japanese Patent Appl. No. 2013-18883, dated Feb. 24, 2015.
Appeal Decision in Japanese Design Patent Application No. 2009-002857 (Appeal No. 2010-002154) mailed Aug. 20, 2010.
Notification of First Office Action in Chinese Patent Application No. 200880009255.7 dated Sep. 26, 2010.
Office Action from U.S. Appl. No. 11/149,998, dated Nov. 20, 2009.
Response to Office Action from U.S. Appl. No. 11/149,998, dated Feb. 22, 2010.
Office Action from U.S. Appl. No. 12/154,691, dated Dec. 17, 2009.
Response to Office Action from U.S. Appl. No. 12/154,691, dated May 17, 2010.
Office Action from U.S. Appl. No. 11/465,120, dated Mar. 9, 2010.
Office Action from U.S. Appl. No. 12/152,766, dated Mar. 12, 2010.
Office Action from U.S. Appl. No. 12/069,827, dated Apr. 20, 2010.
Office Action from U.S. Appl. No. 12/321,059, dated May 17, 2010.
Office Action from U.S. Appl. No. 11/149,998, dated May 18, 2010.
International Search Report for PCT/CN2009/074800 dated Feb. 25, 2010.
Office Action from Canadian Patent Appl No. 2,454,310, dated Feb. 9, 2010.
European Search Report from related European Application No. 07254498.4, received on Feb. 11, 2010.
Office Action from related China appl. No. 200710142310.7, dated Dec. 11, 2009.
Office Action from U.S. Appl. No. 11/600,617, dated Dec. 22, 2009.
Official Communication from EPO regarding European Appl. No. 08253301.9, dated Nov. 17, 2009.
Second Office Action from Chinese Appl. No. 200710142217.6, dated Nov. 6, 2009.
U.S. Appl. No. 11/443,741, filed Jun. 14, 2007, Loh, et al.
U.S. Appl. No. 11/685,761, filed Mar. 13, 2007, Slater, et al.
U.S. Appl. No. 11/939,059, filed Nov. 13, 2007, Trott, et al.
PCT Search Report and Written Opinion PCT/US2007/086237, dated May 8, 2008 in related application.
PCT Search Report and Written Opinion PCT/US2007/12403, dated Aug. 6, 2008.
PCT Search Report and Written Opinion PCT/US2007/086242, dated Mar. 4, 2008.
Notice of First Office Action from related China Patent Appl. No. 200710142217.6, dated Jun. 22, 2009.
Notice Requesting Submission of Opinion re related Korean Application No. 10-2004-7001033, dated Mar. 9, 2009.
Sakai et al., "Experimental Investigation of Dependence of Electrical Characteristics on Device Parameters in Trench MOS Barrier Shottky Diodes", Proceedings of 1998 International Symposium on Power Semiconductor Devices & ICs, Kyoto, pp. 293-296, Jun. 1998.
Zhang AP et al, "Comparison of GAN P-I-N and Schottky Rectifier Performance" IEEE Transactions on Electron Devices, IEEE Inc. New York, US, vol. 48, No. 3, pp. 407-411, Mar. 2001.
European Search Report, Feb. 24, 2009, re related European Application No. EP 08253301.
International Search Report for PCT/US2008/004453, dated Sep. 9, 2008.
Written Opinion for PCT/US2008/004453, dated Sep. 9, 2008.
The Second Office Action from People's Republic of China, re: China Application No. 200480027969.2, dated Jul. 4, 2008.
Kim J K et al. "Strongly Enhanced Phosphor Efficiency in GaInN White Light-Emitting Diodes Using Remote Phosphor Configuration and Diffuse Reflector Cup", Japanese Journal of Applied Physics, Japan Society of Applied Physics, Tokyo, JP, vol. 44, No. 20-23, Jan. 1, 2005, XP-001236966.
T-Clad Thermal Substrates from the Bergquest Company, Chanhassen, MN, www.bergquistcompany.com.
U.S. Appl. No. 11/656,759, filed Jan. 22, 2007, Chitnis, et al.
U.S. Appl. No. 11/899,790, filed Sep. 7, 2007, Chitnis, et al.
U.S. Appl. No. 11/473,089, filed Jun. 21, 2006, Tarsa, et al.
Office Action for Chinese Application No. 2012800586074; dated Mar. 17, 2016.
Office Action for Chinese Application No. 2010106242824; dated Apr. 15, 2016.
Office Action for Chinese Application No. 2010161673462; dated Apr. 26, 2016.
Office Action for U.S. Appl. No. 12/002,410; dated Jun. 14, 2016.
Office Action for U.S. Appl. No. 13/652,241; dated Jul. 1, 2016.
Luxeon Rebel Power Light Source Technical Datasheet DS56; Dated Jul. 2007.
Luxeon Rebel Lumileds Reliability Datasheet RD07; Dated Mar. 2007.
Luxeon rebel Assembly and Handling Information Application Brief AB32; Mar. 2007.
Foreign Notice of Allowance for Taiwan Application No. 100130234; dated Feb. 9, 2017.
Office Action for U.S. Appl. No. 12/875,873; dated Feb. 9, 2017.
Office Action for U.S. Appl. No. 14/478,571; dated Mar. 13, 2017.
Foreign Office Action for European Application No. 7789665.2; dated Mar. 17, 2017.
Foreign Office Action for Chinese Application No. 2012800586074: dated Nov. 21, 2016.
Examination Report from European Application No. 7789665.2; dated Jul. 13, 2016.

(56) References Cited

OTHER PUBLICATIONS

Office Action for U.S. Appl. No. 12/069,827; dated Jul. 14, 2016.
Office Action for U.S. Appl. No. 12/875,873; dated Aug. 12, 2016.
Office Action for U.S. Appl. No. 14/329,807; dated Aug. 15, 2016.
Foreign Office Action for Chinese Application 2010106242824; dated Sep. 5, 2016.
Office Action for U.S. Appl. No. 13/652,241; dated Sep. 29, 2016.
Office Action for U.S. Appl. No. 13/804,309; dated Mar. 24, 2017.
Chinese Office Action for Application No. 2010106242824; dated Apr. 1, 2017.
European Notice of Allowance for Application No. 07789665.2; dated May 4, 2017.
Office Action for U.S. Appl. No. 12/875,873; dated May 18, 2017.
Office Action for U.S. Appl. No. 12/002,410; dated Jun. 30, 2017.
Chinese Decision of Rejection for Application No. 201010167346.2; dated Jun. 20, 2017.
Office Action for U.S. Appl. No. 12/875,873; dated Sep. 26, 2017.
Office Action for U.S. Appl. No. 13/804,309; dated Oct. 11, 2017.
Office Action for U.S. Appl. No. 12/002,410; dated Nov. 3, 2017.
Office Action for U.S. Appl. No. 14/478,571; dated Nov. 29, 2017.
European Office Action for Application No. 08713756.8; dated Oct. 18, 2017.
European Documents for Grant for Application No. 08713756.8; WO 2008/089165; PCT/US2008/051039.
Office Action for U.S. Appl. No. 12/875,873; dated Jan. 12, 2018.
Office Action for U.S. Appl. No. 12/002,410; dated Mar. 29, 2018.
Office Action for U.S. Appl. No. 14/478,571; dated Mar. 30, 2018.
Indian Examination Report for Application No. 8640/DELNP/2011; dated Jun. 15, 2018.
Office Action for U.S. Appl. No. 12/875,873; dated May 29, 2018.
Office Action for U.S. Appl. No. 12/875,873; dated Aug. 28, 2018.
Notice of Completion of Formalities for Patent Register from Chinese Patent Appl. No. 2011100391389, dated Mar. 9, 2015.
Office Action from European Patent Appl. No. 07840092.6-1551, dated May 4, 2015.
Notice of Allowance from Chinese Appl. No. 200880009255.7, dated Apr. 2, 2015.
Notice of Completion of Pretrial Reexamination from Japanese Appl. No. 2012-268000, dated May 22, 2015.
First Office Action from Chinese Appl. No. 2010106242824, dated Feb. 17, 2015.

* cited by examiner

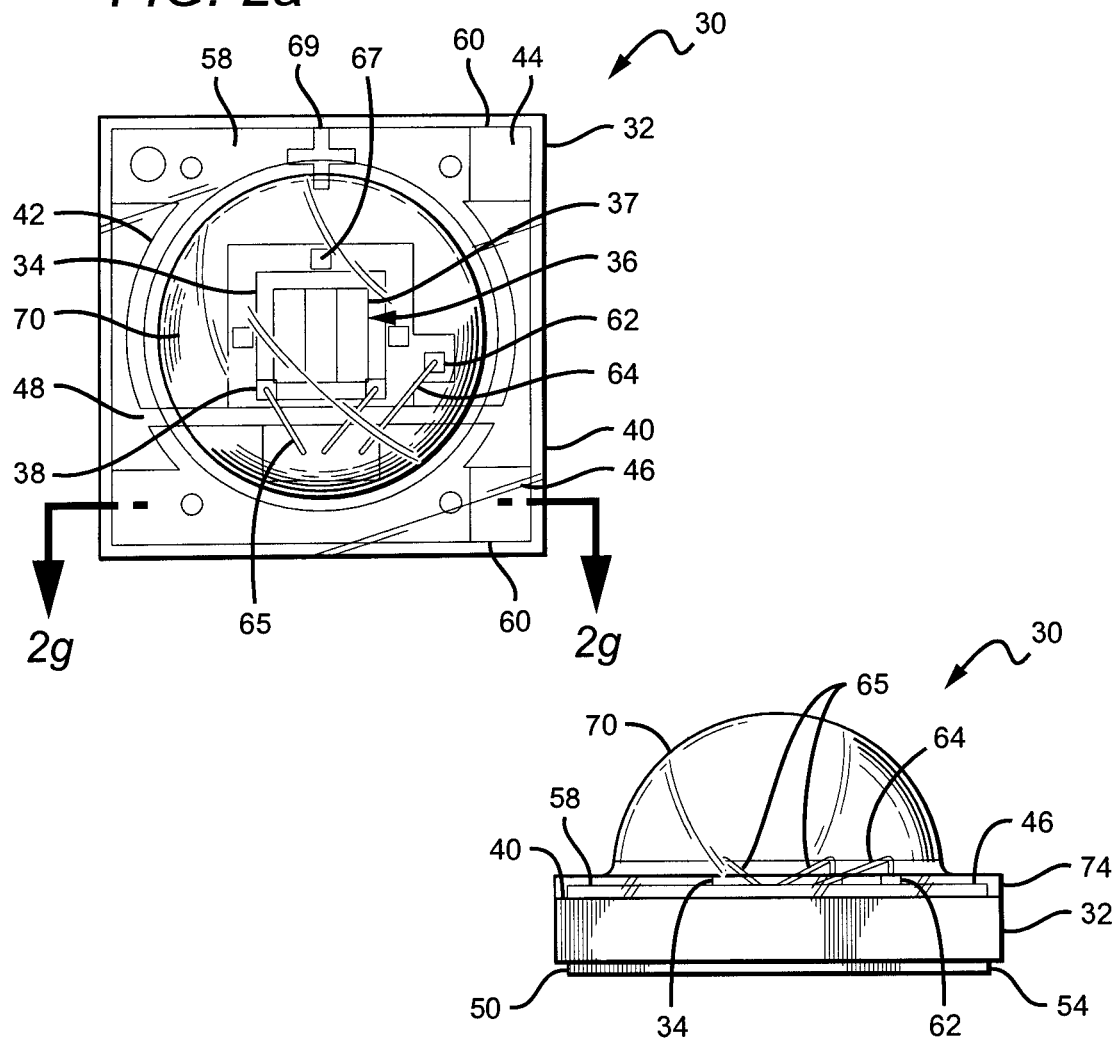
FIG. 2a
FIG. 2b
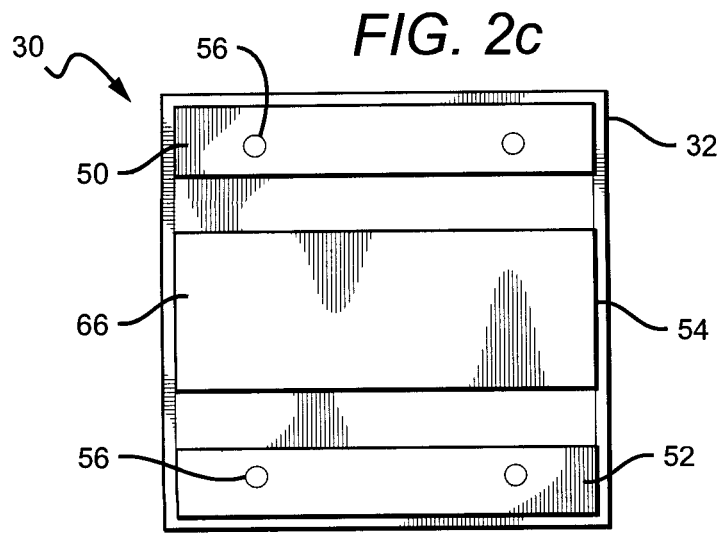
FIG. 2c

FIG. 7a
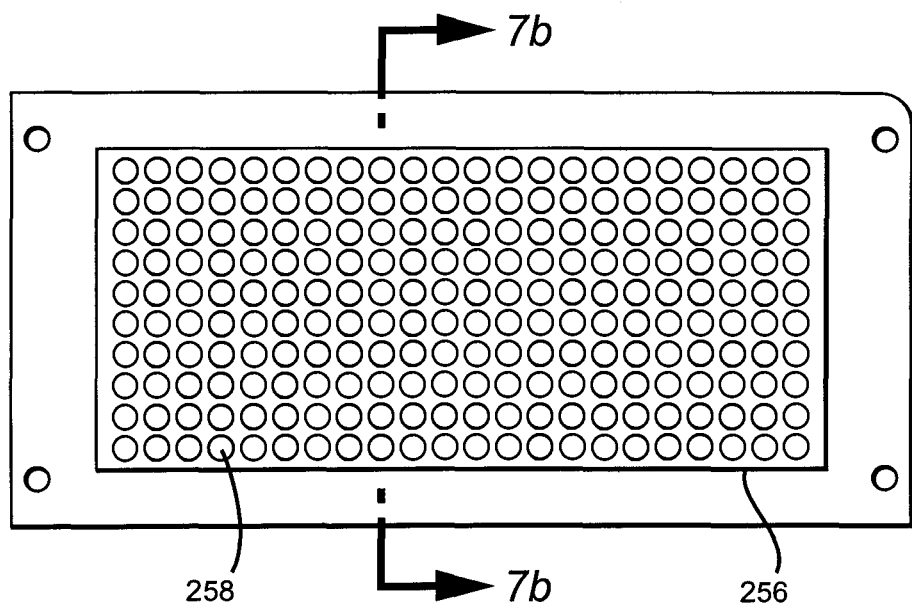
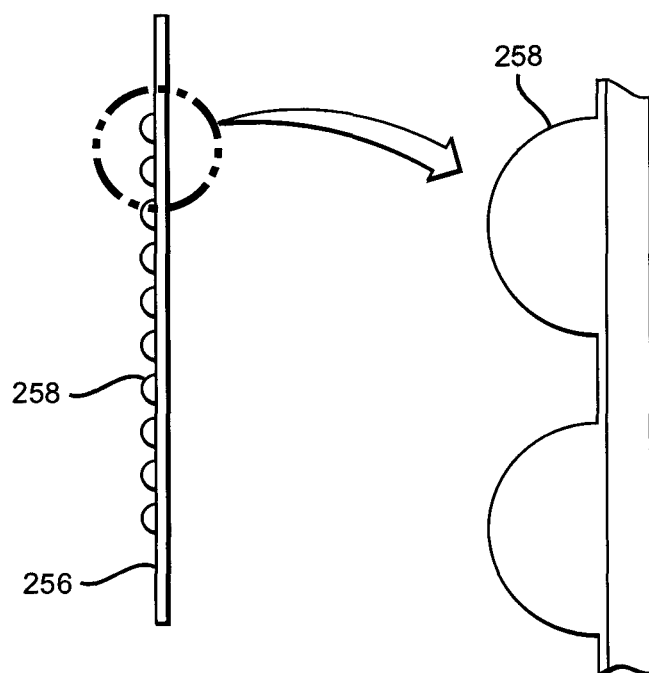
FIG. 7b

LIGHT EMITTING DIODE PACKAGE AND METHOD FOR FABRICATING SAME

This application is a divisional of, and claims the benefit of, U.S. patent application Ser. No. 11/982,275 to Keller et al., filed on Oct. 31, 2007.

BACKGROUND OF THE INVENTION

Field of the Invention

This invention relates to light emitting diodes, and in particular to light emitting diode packages having a molded lens.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, focusing and the like. An LED package also includes electrical leads, contacts or traces for electrically connecting the LED package to an external circuit. In a typical LED package 10 illustrated in FIG. 1A, an LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 containing a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup instead of being reflected). In addition, heat retention may be an issue for a package such as the package 10 shown in FIG. 1A, since it may be difficult to extract heat through the leads 15A, 15B.

A conventional LED package 20 illustrated in FIG. 1B may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the carrier 23. The mounted LED chips 22 are then covered with an encapsulant 26, which may provide environmental and mechanical protection to the chips while also acting as a lens. The metal reflector 24 is typically attached to the carrier by means of a solder or epoxy bond.

While a package such as the package 20 illustrated in FIG. 1B may have certain advantages for high power operation, there may be a number of potential problems associated with using a separate metal piece as a metal reflector. For example, small metal parts may be difficult to manufacture repeatable with a high degree of precision at a reasonable expense. In addition, since the reflector is typically affixed to a carrier using an adhesive, several manufacturing steps may be required to carefully align and mount the reflector, which may add to the expense and complexity of the manufacturing process for such packages.

For higher powered operation it may also be difficult to transfer dissipate heat generated by the LED chip 22. Submounts can be made of materials such as ceramics that are robust but do not efficiently conduct heat. Heat from the LED chip passes into the submount below the LED chip, but does not efficiently spread outward from below the LED where it can then dissipate. Heat from the LED tends to localize below the LED and can increase as operation of the LED package. This increased heat can result is reduced lifetime or failure of the package.

SUMMARY OF THE INVENTION

One embodiment of an LED package according to the present invention comprises a submount having a top and bottom surface with a plurality of top electrically and thermally conductive elements on its top surface. An LED is included on one of the top elements such that an electrical signal applied to the top elements causes the LED to emit light. The electrically conductive elements also spread heat from the LED across the majority of the submount top surface. A bottom thermally conductive element is included on the bottom surface of said submount and conducts heat from the submount. A lens is formed directly over the LED.

Another embodiment of an LED package according to the present invention comprises a submount having a top and bottom surface with an attach pad on the top surface, a first contact pad on the top surface is integral to the attach pad, and a second contact pad on the top surface. An LED is mounted to the attach pad, and when an electrical signal is applied to the first and second contact pads causing the LED to emit light. The pads also comprise thermally conductive layers covering most of the top surface to spread heat from the LED to the majority of the top surface. An optical element is formed directly over said LED.

Another embodiment of an LED package according to the present invention comprises, a submount having a top and bottom surface, with an LED mounted on the top surface. A lens is formed directly on the LED and a portion of the top surface. A top heat spreading element on the top surface spreads heat from the LED across the majority of the top surface, and a bottom heat spreading element on the bottom surface of the submount that conducts heat from the submount.

One embodiment of a method for fabricating LED packages according to the present invention, comprises providing a submount panel sized to be separated into a plurality of LED package submounts. Top conductive elements are formed on one surface of the submount panel for a plurality of LED packages. LEDs are attached to the top elements with the LEDs electrically connected to the top conductive elements. Lenses are molded over the LEDs and the substrate panel is singulated to separate it into a plurality of LED packages.

A method for fabricating a plurality of surface mount LED packages according to the present invention, comprises providing a submount panel sized to accommodate formation of a plurality of LED packages. Sets of attach pads and contact pads are formed on one surface of the submount panel, with each of the sets corresponding to one of the LED packages to be formed from said submount panel. A plurality of LEDs are attached to the submount panel with each of the LEDs attached and electrically connected to one of the sets of attach pads and contact pads. A plurality of lenses are molded on the submount panel with each of the lenses over one of the LEDs. Sets of surface mount contacts are formed on the surface of the submount panel opposite the sets of attach pads and contact pads, each of the sets of surface mount contacts corresponding to a respective one of the sets of attach pads and contact pads. The substrate panel is singulated to separate it into a plurality of LED packages.

These and other aspects and advantages of the invention will become apparent from the following detailed description and the accompanying drawings which illustrate by way of example the features of the invention.

BRIEF DESCRIPTION OF THE DRAWINGS

FIG. 2a is a top view of one embodiment of an LED package according to the present invention;
FIG. 2b is a side view of the LED package shown in FIG. 2a;
FIG. 2c is a bottom view of the LED package shown in FIG. 2a;
FIG. 2d is an upper perspective view of the LED package shown in FIG. 2a;
FIG. 2e is a bottom perspective view of the LED package shown in FIG. 2a;
FIG. 2f is an exploded view of the LED package shown in FIG. 2a;
FIG. 3b is top view of the LED package shown in FIG. 3a;
FIG. 3c is a bottom view of the LED package shown in FIG. 3a;
FIG. 3d is an upper perspective view of the LED package shown in FIG. 3a;
FIG. 3e is a bottom perspective view of the LED package shown in FIG. 3a;
FIG. 4b is a bottom perspective view of the LED package shown in FIG. 2a;
FIG. 6b is another sectional view of the lens mold shown in FIG. 5a;
FIG. 7a is a plan view of one embodiment of a submount panel with lenses arranged according to the present invention;
and
FIG. 7b is a sectional view of the submount panel taken in FIG. 7a taken along section lines 7b-7b.

DETAILED DESCRIPTION OF THE INVENTION

Figure 1A:
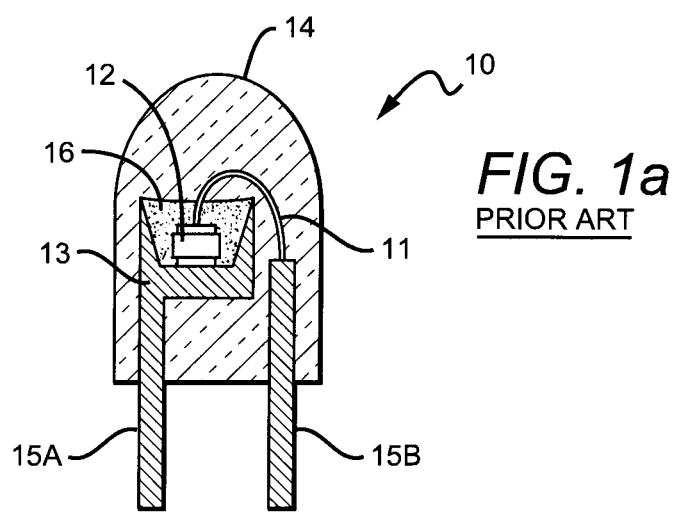
FIG. 1A is a sectional view of a prior art LED package.
Figure 1B:
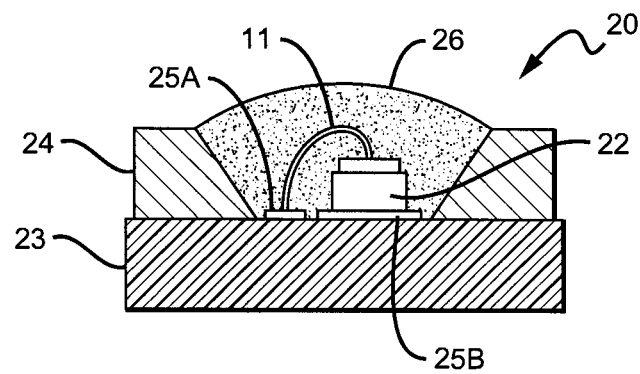
FIG. 1B is a sectional view of another prior art LED package.
Figure 2G:
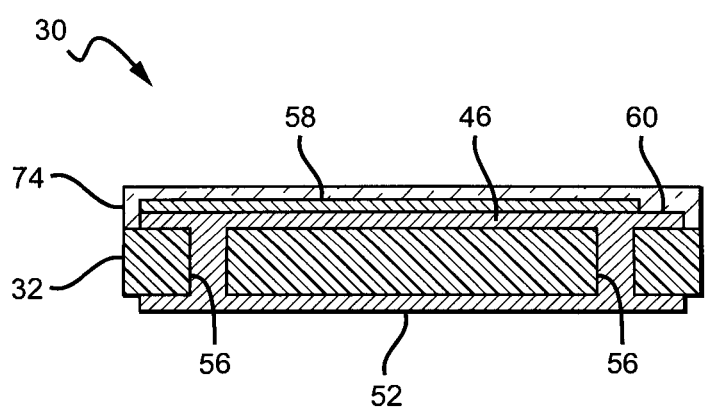
FIG. 2g is a sectional view of the LED package shown in FIG. 2a, taken along section lines 2g-2g.
Figure 2D:
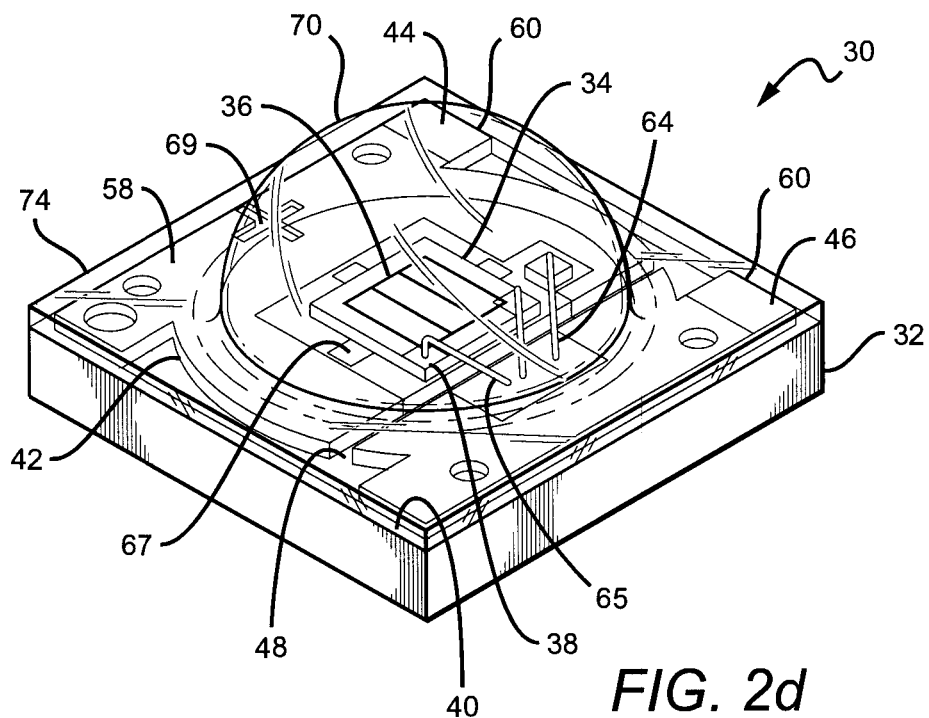
Figure 2E:
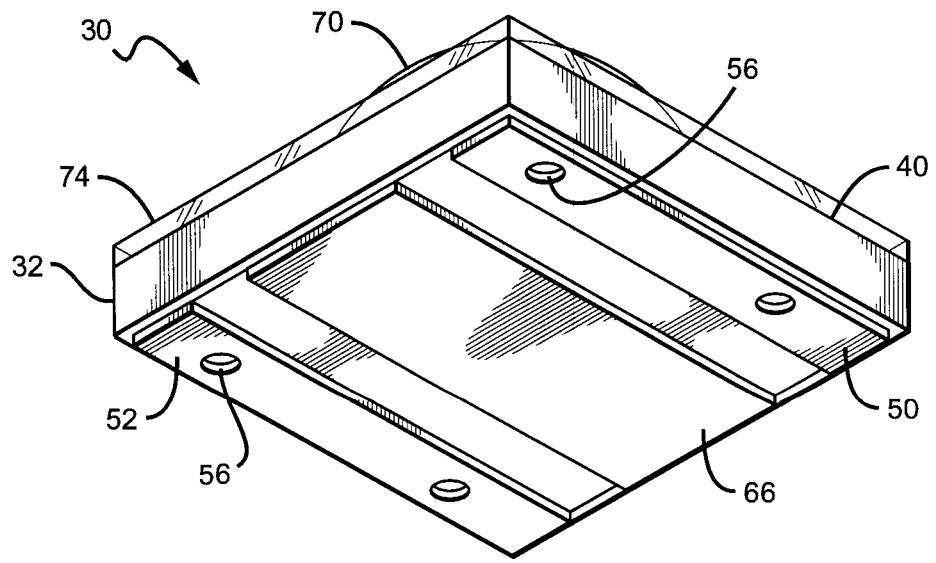
Figure 2F:
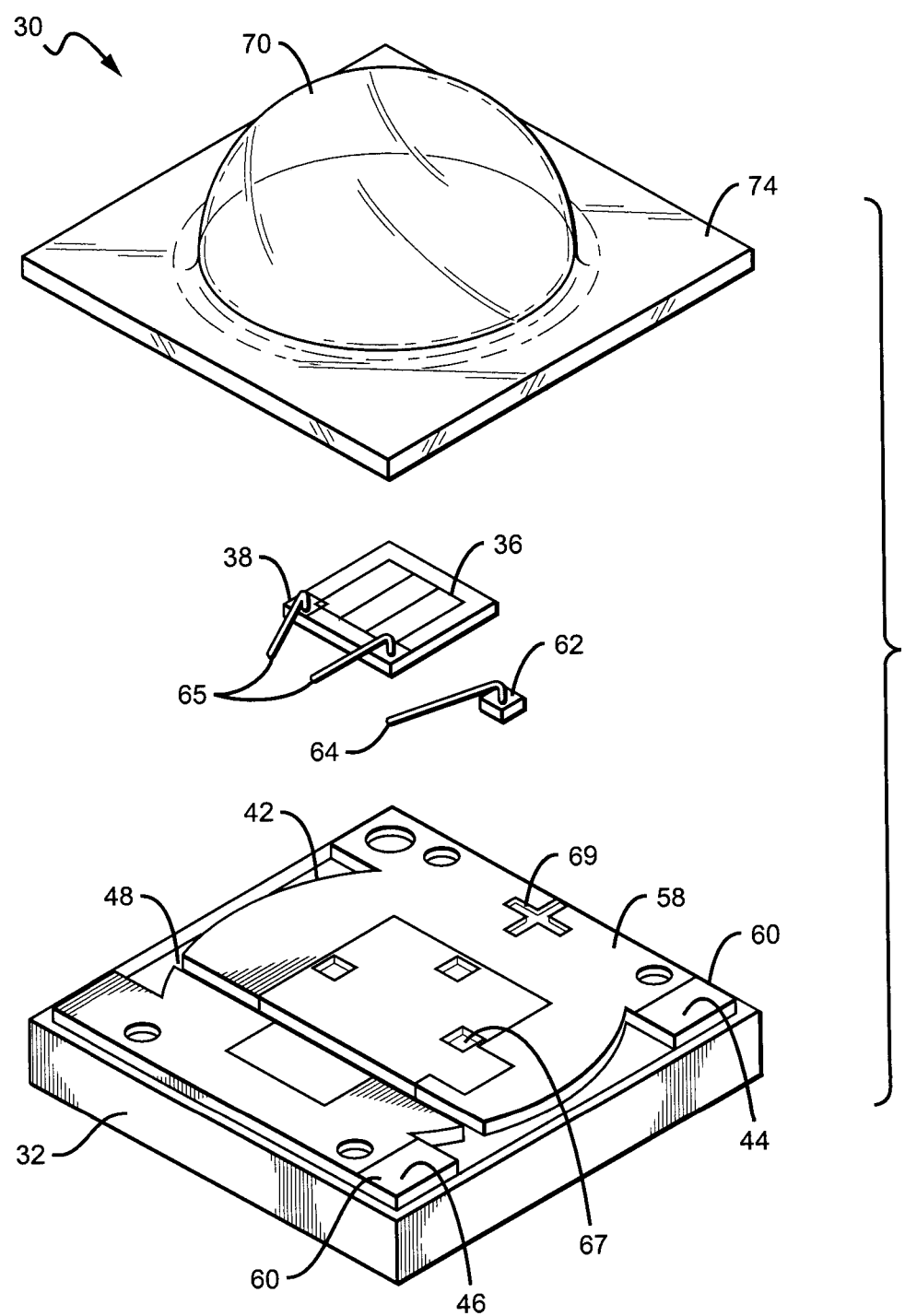
Figure 3A:
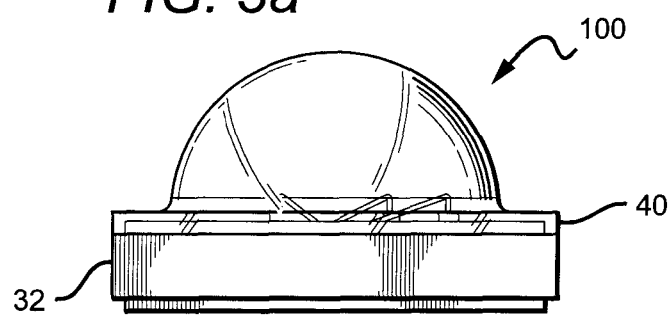
FIG. 3a is a side view of another embodiment of an LED package according to the present invention.
Figure 3B:
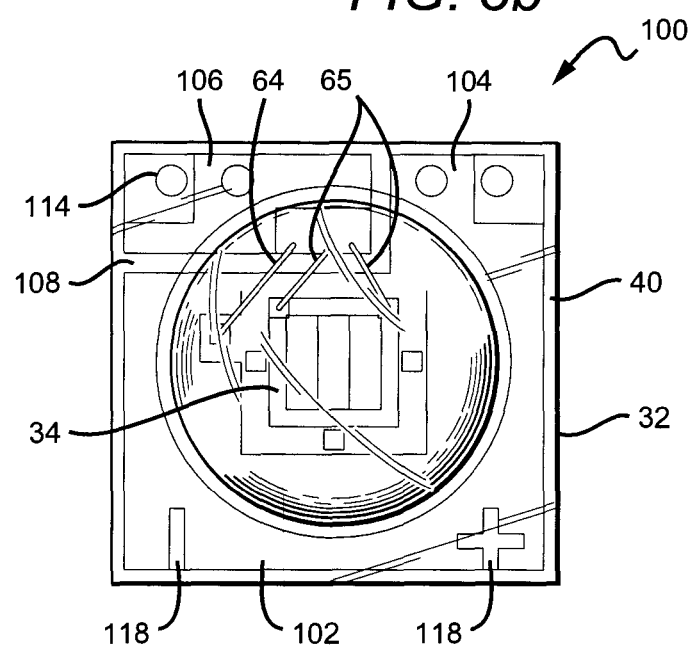
Figure 3C:
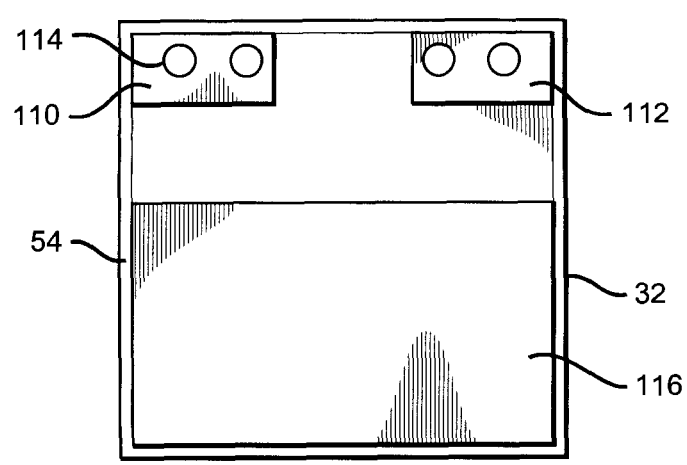
Figure 3D:
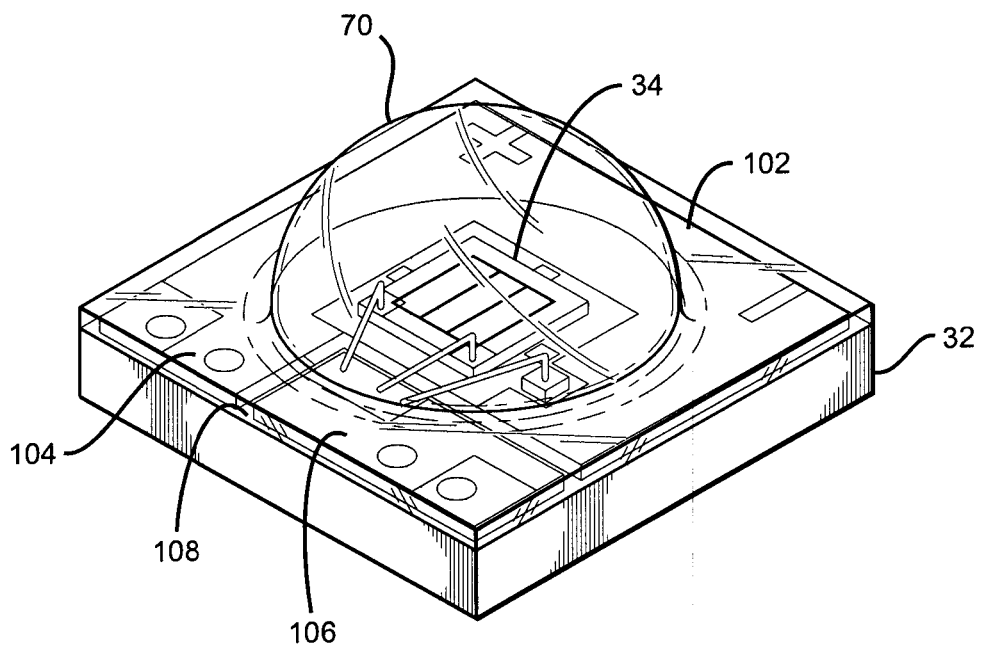
Figure 3E:
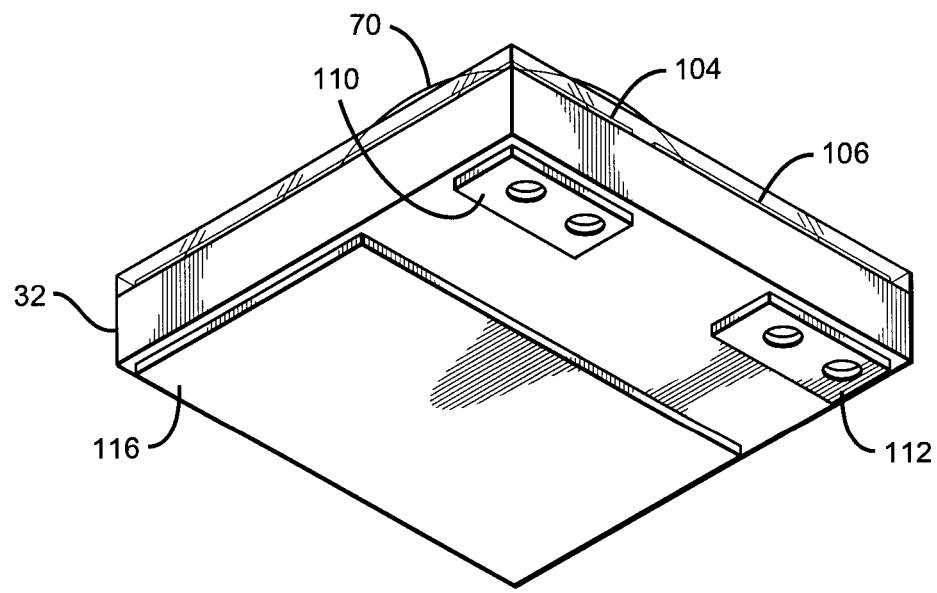

The present invention is directed to compact, simple and efficient LED packages and methods for manufacturing same. Different embodiments can comprise one or more high power LEDs that typically operate at elevated temperatures. Packages according to the present invention can include features to provide for improved thermal management by spreading the heat from the LED. The heat can then dissipate into the ambient. The packages according to the present invention can also comprise a lens molded directly over the one or more LEDs to protect the LED while still allowing for efficient emission characteristics.

The present invention is also directed to methods for fabricating LED packages using processing steps that allow for the simultaneous formation of a plurality of packages. This can reduce the manufacturing complexity and cost of LED package fabrication.

The present invention provides low cost, relatively small size LED packages that provide an efficient but small light source. The packages according to the present invention are particularly adapted to surface mount technologies and provide features that allow for the good thermal dissipation, allowing the packages to operate at elevated power levels without overheating.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The present invention can be used in with many different solid state emitters with the embodiments of the invention below being described in relation to LEDs, and in particular to white emitting LEDs and LED packages. It is understood that the present invention can also use other solid state emitter packages beyond the embodiment shown. The present invention can also be used with multiple emitter packages, such as LED packages having more than one LED. The present invention can be used in any application wherein a conversion material is used to down-convert the wavelength of light from an emitter, and the discussion of the present invention with reference to the following embodiment should not be construed as limiting to the that particular embodiment or similar embodiments.

FIGS. 2a through 2g show one embodiment of an LED package 30 according to the present invention generally comprising a substrate/submount ("submount") 32 with one or more LEDs emitting the same or different colors. In the embodiment shown, a single LED 34 is mounted on the submount 32. The LED 34 can have many different semiconductor layers arranged in different ways. LED structures and their fabrication and operation are generally known in the art and only briefly discussed herein. The layers of the LED 34 can be fabricated using known processes with a suitable process being fabrication using metal organic chemical vapor deposition (MOCVD). The layers of the LEDs 34 generally comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed.

It is also understood that additional layers and elements can also be included in the LED 34, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such at sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide are typically not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

The LED 34 can also comprise a conductive current spreading structure 36 and wire bond pads 38 on its top surface, both of which are made of a conductive material and can be deposited using known methods. Some materials that can be used for these elements include Au, Cu, Ni, In, Al, Ag or combinations thereof and conducting oxides and transparent conducting oxides. The current spreading structure 36 generally comprises conductive fingers 37 arranged in a grid on the LED 34 with the fingers spaced to enhance current spreading from the pads 38 into the LED's top surface. In operation, an electrical signal is applied to the pads 38, such as through a wire bond as described below, and the electrical signal spreads through the fingers 37 of the current spreading structure 36 and the top surface into the LED 34. Current spreading structures are often used in LEDs where the top surface is p-type, but can also be used for n-type materials.

The LED can be coated with one or more phosphors with the phosphors absorbing at least some of the LED light and emitting a different wavelength of light such that the LED emits a combination of light from the LED and the phosphor. In a preferred embodiment the LED emits a white light combination of LED and phosphor light. The LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The submount 32 can be formed of many different materials with a preferred material being electrically insulating. Suitable materials include, but are not limited to ceramic materials such as aluminum oxide, aluminum nitride or organic insulators like polyimide(PI) and polyphthalamide (PPA). In other embodiments the submount 32 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board. As more fully described below, LED packages according to the present invention can be fabricated using a method that utilizes a submount panel sized to accommodate a plurality of sumbmounts. Multiple LED packages can be formed on the panel, with the individual packages being singulated from the panel.

The submount 32 has a top surface 40 comprising patterned conductive features that can include a die attach pad 42 with an integral first contact pad 44. A second contact pad 46 is also included on the submount's top surface 40 with the LED 34 mounted approximately at the center of the attach pad 42. These patterned conductive features provide conductive paths for electrical connection to the LED 34 using known contacting methods. The LED can be mounted to the attach pad 42 using known methods and material mounting such as using conventional solder materials that may or may not contain a flux material or dispensed polymeric materials that may be thermally and electrically conductive.

The size of the submount 32 in package 30 can vary depending on different factors, with one being the size of the LED. For example, the size of the package 30 can be essentially of the same dimension as the effective heat spreading area in the attach pad, and first and second contact pads 42, 44, and 46. In a package having a 1 mm LED, the submount can be approximately 3.5 mm by 3.5 mm; with a package having a 0.7 mm chip it can be 3.2 mm by 3.2 mm and generally of square shape in both cases. It is further understood that the submount can have other shapes including circular, rectangular or other multiple sided shapes.

The attach pad 42 and first and second contact pads 44, 46 can comprise much different material such as metals or other conductive materials. In one embodiment the pads 42, 44, 46 comprise copper deposited using known techniques such as plating. In typical plating process a titanium adhesion layer and copper seed layer are sequentially sputtered onto a substrate. Then, approximately 75 microns of copper is plated onto the copper seed layer. The resulting copper layer being deposited can then be patterned using standard lithographic processes. In other embodiments the layer can be sputtered using a mask to form the desired pattern.

In some embodiments according to the present invention some of the conductive features can include only copper, with others of the features including additional materials. For example, the attach pad 42 can be plated or coated with additional metals or materials to the make the attach pad 42 more suitable for mounting an LED 34. For example, the attach pad 42 can be plated with adhesive or bonding materials, or reflective and barrier layers.

A gap 48 (best shown in FIGS. 2*a* and 2*d*) is included between the second pad 46 and the attach pad 42 down to the surface of the submount 32 that, with the gap providing electrical isolation between the attach pad 42 and second pad 46. As more further described below, an electrical signal is applied to the LED 34 through the second pad 46 and the first pad 44, with the electrical signal on the first pad 44 passing directly to the LED 34 through the attach pad 42 and the signal from the second pad passing into the LED 34 through wire bonds. The gap 48 provides electrical isolation between the second pad and attach pad to prevent shorting of the signal applied to the LED 34.

In some embodiments an electrical signal can be applied to the package 30 by providing external electrical contact to the first and second bond pads 44, 46 such as by solder contacts or other conductive paths to a PCB. In the embodiment shown the LED package 30 is arranged for mounting using surface mount technology and having internal conductive paths. The LED 30 comprises first and second surface mount pads 50, 52 (best shown in FIGS. 2*c* and 2*e*) that can be formed on the submount's back surface 54, at least partially in alignment with the first and second contact pads 44, 46, respectfully. Conductive vias 56 are formed through the submount 32 between the first mounting pad 50 and the first contact pad 44, such that when a signal is applied to the first mounting pad 50 is conducted to first contact pad 44. Similarly, conductive vias 56 are formed between the second mounting pad 52 and second contact pad 46 to conduct an electrical signal between the two. The first and second mounting pads 50, 52 allow for surface mounting of the LED package 30 with the electrical signal to be applied to the LED 34 applied across the first and second mounting pads 50, 52. The vias 56 and mounting pads 50,52 can made of many different materials deposited using different techniques, such as those used for the attach and contact pads 42, 44, 46.

It is understood that the mounting pads 50, 52 and vias 56 can be arranged in many different ways and can have many different shapes and sizes. It is also understood that instead of vias, one or more conductive traces can be provided on the surface of the submount between the mounting pads and contact pads, such as along the side surface of the submount.

A solder mask 58 made of conventional materials can be included on the submount's top surface 40, at least partially covering the attach pad 42 and the first and second contact pads 44, 46, and at least partially covering the gap 48. The solder mask 58 protects these features during subsequent processing steps and in particular mounting the LED 34 to the attach pad 42 and wire bonding. During these steps there can be a danger of solder or other materials depositing in undesired areas, which can result in damage to the areas or result in electrical shorting. The solder mask serves as an insulating and protective material that can reduce or prevent these dangers. The solder mask comprises an opening for mounting the LED 34 to the attach pad 42 and for attaching wire bonds to the second contact pad 46. It also comprises side openings 60 to allow convenient electrical access to the contact pads 44, 46 for testing the package 30 during fabrication. The solder mask 58 also has alignment holes that provide for alignment during fabrication of the package 30 and also allow for alignment when mounted in place by the end user.

In some embodiments the solder mask can be provided with a symbol or indicator 69 to illustrate which side of the LED package 30 should be coupled to the plus or minus of the signal to be applied to the package. This can ensure accurate mounting of the LED package 30 to a PCB or other fixture, whether by machine or hand. In the embodiment shown the symbol 69 comprises a plus (+) sign over the first contact pad 44, indicating that the package 30 should be mounted with the positive of the signal coupled to the first mounting pad 50. The minus of the signal would then be coupled to the second mounting pad 52. It is understood that many different symbol types can be used and that a symbol can also be included over the second conductive pad 46. It is also understood that the symbols can be placed in other locations other than the solder mask 58.

The package 30 can also comprise elements to protect against damage from electrostatic discharge (ESD). In the embodiment shown the elements are on-chip, and different elements can be used such as various vertical silicon (Si) Sener diodes, different LEDs arranged in parallel and reverse biased to the LED 34, surface mount varistors and lateral Si diodes. In the embodiment shown a Zener diode 62 is utilized and is mounted to the attach pad 42 using known mounting techniques. The diode is relatively small so that it does not cover an excessive area on the surface of the submount 32.

It is noted that the solder mask 58 includes and opening for the ESD diode 62 so that it can be mounted to the attach pad 42. Different mounting materials and methods can be used such as those used to mount the LED 34 to the attach pad 42. An ESD wire bond 64 is included between the second contact pad 46 at the solder mask opening and the ESD diode 62. Two LED wire bonds 65 are also included between the solder mask opening in the second contact pad 46 and wire bond pads 38 on the LED 34. In other embodiments only one wire bond can be included between the LED 34 and second contact pad. This LED 34 and ESD diode 62 arrangement allows excessive voltage and/or current passing through the LED package 30 from an ESD event to pass through the diode 62 instead of the LED 34, protecting the LED 34 from damage. The wire bonds 64 and 65 can be applied using known methods and can comprise known conductive materials, with a suitable material being gold (Au). It is understood that in other embodiments of an LED package according to the present invention can be provided without an ESD element/diode or with an ESD element/diode that is external to the LED package 30.

As mentioned above, heat typically does not spread efficiently into the submount 32, particularly those made of materials such as ceramic. When an LED is provided on an attach pad that extends generally only under the LED, heat does not spread through most of the submount, and is generally concentrated to the area just below the LED. This can cause overheating of the LED which can limit the operating power level for the LED package.

To improve heat dissipation in the LED package 30 the pads 42, 44, 46 provide extending thermally conductive paths to laterally conduct heat away from the LED 34 such that it can spread to other areas of the submount beyond the areas just below the LED 34. The attach pad 42 covers more of the surface of the submount 32 than the LED 34, with the attach pad extending from the edges of the LED 34 toward the edges of the submount 32. In the embodiment shown, the attach pad 42 is generally circular and extending radially from LED 34 toward the edges of the submount 32. A portion of the attach pad 42 intersects with the first and second contact pads 44, 46, with the gap 48 separating part of the attach pad adjacent to the second contact pad 46. It is understood that the contact pad 42 can be many other shapes and in some embodiments it can extend to the edge of the submount 32.

The contact pads 44, 46 also cover the surface of the submount 32 extending out from the vias, and covering the area between the vias 56, and the area between the vias 56 and the edges of the submount 32. By extending the pads 42, 44 and 46 this way, the heat spreading from the LED 34 is improved. This improves thermal dissipation of heat generated in the LED 34, which improves its operating life and allows for higher operating power. The pads 42, 44, and 46 can cover different percentages of the top surface 40 of the submount 32, with a typical coverage area being greater than 50%. In the LED package 30, the pads 42, 44 and 46 can cover approximately 70% of the submount. In other embodiments the coverage area can be greater than 75%.

The LED package 30 can further comprise a metalized area 66 on the back surface 54 of the submount, between the first and second mounting pads 50, 52. The metalized area is preferably made of a heat conductive material and is preferably in at least partial vertical alignment with the LED 34. In one embodiment, the metalized area is not in electrical contact with the elements on top surface of the submount 32 or the first and second mounting pads on the back surface of the submount 32. Although heat from the LED is laterally spread over the top surface of the submount by the attach pad 42 and the pads 44, 46 more heat will pass into the submount 32 directly below and around the LED 34. The metalized area can assist with this dissipation by allowing this heat to spread into the metalized area where it can dissipate more readily. It is also noted that the heat can conduct from the top surface of the submount 32, through the vias 56, where the heat can spread into the first and second mounting pads 50, 52 where it can also dissipate. For the package 30 used in surface mounting, the thickness of the metalized area 66 (best shown in FIGS. 2c and 2e) and the first and second pads 50, 52 should be approximately the same such that all three make contact to a lateral surface such as a PCB.

Three solder dams 67 can be included around the area of the attach pad 42 for mounting of the LED 34, with the solder dams serving to help center the LED and to reduce movement of the LED from the mounting area during while the mounting solder is in liquid form. When the liquid solder encounters any one of the dams, movement is slowed or stopped. This helps reduce the movement of the LED until the solder hardens.

An optical element or lens 70 is formed on the top surface 40 of the submount 32, over the LED 34, to provide both environmental and/or mechanical protection. The lens 70 can be in different locations on the top surface 40 with the lens located as shown with the LED 34 at approximately the center of the lens base. In some embodiments the lens can be formed in direct contact with the LED 34 and the submount's top surface 40. In other embodiments there may be an intervening material or layer between the LED 34 and/or top surface 40. Direct contact to the LED 34 provides certain advantages such as improved light extraction and ease of fabricating.

As further described below, the lens 70 can be molded using different molding techniques and the lens can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that the lens 70 can also be textured to improve light extraction or can contain materials such as phosphors or scattering particles.

The LED package 30 can also comprise a protective layer 74 covering the submount's top surface 40 between the lens 70 and edge of the submount 32. The layer 74 provides additional protection to the elements on the top surface to reduce damage and contamination during subsequent processing steps and use. Protective layer 74 can be formed during formation of the lens 70 and can comprise the same material as the lens 70. It is understood, however, that the LED package 30 can also be provided without the protective layer 74.

The lens 70 should also be able to withstand certain sheer forces before being displaced from the submount 32. In one embodiment, the lens can withstand a 1 kilogram (kg) or more sheer force. In embodiments of the LED package using silicones that are harder after curing and have a higher durometer reading, such as Shore A 70 or higher, tend to better withstand sheer forces. Properties such as high adhesion and high tensile strength may also contribute to the ability of the lens to withstand sheer forces.

The lens arrangement of the LED package 30 is also easily adapted for use with secondary lens or optics that can be includes over the lens by the end user to facilitate beam shaping. These secondary lenses are generally known in the art, with many of them being commercially available.

FIGS. 3a to 3e show another embodiment of an LED package 100 according to the present invention having similar features to those in LED package 30. For similar features the same reference numbers are used herein and in FIGS. 4a and 4b below with the understanding that the description above applies equally to this embodiment. The LED package 100 comprises a submount 32, and LED 34, a lens 70 and wire bonds 64 and 65. Like the LED package 30, LED package 100 is arranged for surface mounting but has a different arrangement for its conductive pads that provides for contacting at one side of the submount 32.

The LED package comprises an attach pad 102 with an integral first contact pad 104, separated by a gap 108 from a second contact pad 106. A gap 108 provides electrical isolation as described above. The LED 34 is mounted to the attach pad using the methods described above, and the wire bond 65 runs between the second contact pad 106 to conduct the electrical signal at the second contact pad 106 to the LED 34. The first and second contact pads 104, 106 are not on opposite sides of the submount 32, but are instead on the same side. The attach pad 102 covers most of the submount's top surface 40 to provide improved heat spreading as described above. The first and second contact pads 104, 106 also cover portions of the top surface to assist in current spreading.

First and second surface mount contact 110, 112 are included on the submount's back surface 54, at least in partial vertical alignment with the first and second contact pads 104, 106, respectively. Conductive vias 114 run through the submount between the first surface mount contact 110 and the first contact pad 104, and the second surface mount contact 112 and the second contact pad 106, so that an electrical signal on the surface mount contacts 110, 112 is conducted through the vias to the contact pads 104, 106. The signal is then conducted to the LED 34. The LED package 100 also comprises a metalized area 116 to further improve heat spreading from the LED 34 and submount 32. The metalized area 116, however, is not between the surface mount contacts 110, 112 but covers an area of the back surface 54 opposite them.

The LED package 100 as shown does not have a protective layer covering the submount's top surface 40 between the edge of the lens 70 and the edge of the top surface 40, although such a protective layer can be included in other embodiments. The LED package 100 can also be provided with an ESD protection element 62 and solder mask 58 as described above. The LED package 100 provides for improved thermal management as in LED package 30, but allows for surface mount contacting along one side of the submount instead of opposite sides. The LED package can also include symbols 118 to assist in alignment by the end user.

Figure 4A:
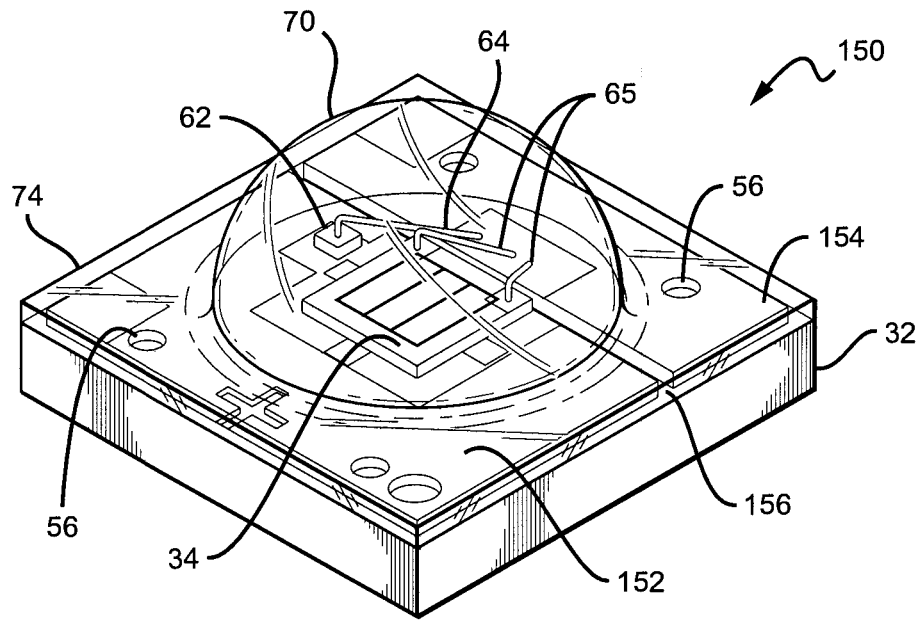
FIG. 4a is an upper perspective view of another embodiment of an LED package according to the present invention.
Figure 4B:
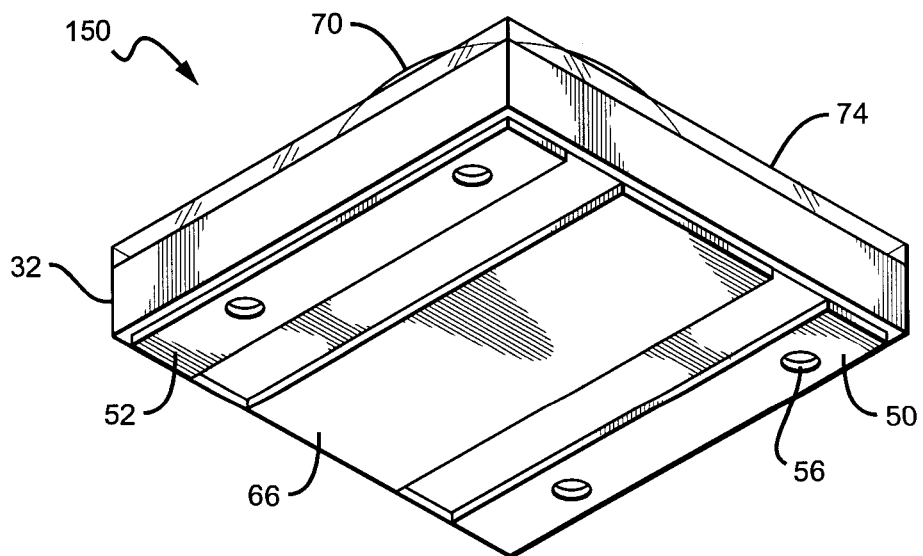

FIGS. 4a and 4b show still another embodiment of an LED package 150 according to the present invention generally comprising a submount 32, LED 34, first and second contact pads 50, 52, vias 56, ESD diode 62, wire bonds 64, 65, metalized area 66, lens 70 and protective layer 74. In this embodiment, however, the attach pad is not circular, but in combination with the first contact pad, comprises a rectangular shaped first conductive layer 152 on and covering the majority the submount 32. Vias 56 run between the first layer 152 and the first contact pad 50 on one side of the first layer 152, with the LED and ESD diode mounted to a attach pad area on the opposing side.

A second conductive layer 154 covers most of the remainder of the submount's top surface, with a gap 156 between the first and second layers 152, 154. Vias 56 run between the second layer 154 and the second contact pad 52, with the wire bonds 64, 65 running between the second layer 154 and the LED 43 and ESD diode 62. Like the embodiments above, an electrical signal applied to the first and second contact pads 50, 52 is conducted to the LED 34, causing it to emit light.

In this embodiment, the first and second layers 152, 154 cover substantially all of the submount's top surface, providing the capability for broad lateral heat spreading from the LED 34. This arrangement, however, presents a minimal pattern for pattern recognition during assembly. By comparison, the shaped pad arrangement shown in FIGS. 2a-2g provides for greater pattern recognition for assembly, while at the same time providing suitable lateral current spreading.

Figure 5:
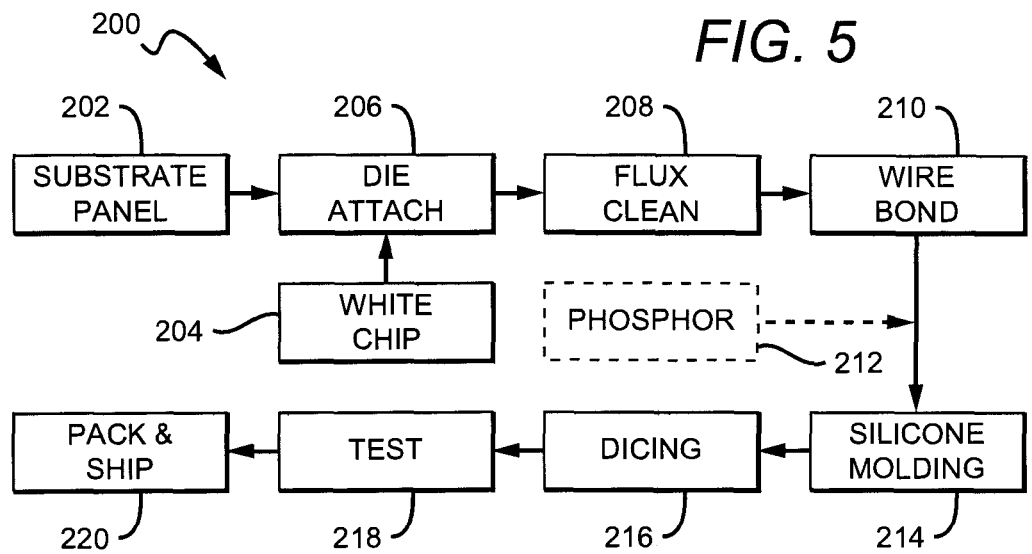
FIG. 5 is a flow diagram for one embodiment of a fabrication method according to the present invention.

The present invention also provides for improved methods for fabricating LED packages wherein multiple packages can be fabricated simultaneously. This reduces cost and complexity in fabrication, and allows for fabrication of devices with controlled features and emission characteristics. FIG. 5 shows one embodiment of an LED package fabrication method 200 according to the present invention. In 202 a substrate (submount) panel that can be diced in subsequent manufacturing steps to provide a plurality of individual submounts. A panel is provided to allow for the simultaneous fabrication of a plurality of packages. It is understood that a separate processing step is required for providing the LED package conductive features on the panel. These features can include the attach pad, contact pads, surface mount pads, vias and metalized area, all of which can be arranged to assist in dissipating heat generated by the LED. The panel will comprise a plurality of these features arranged in sets, each of the sets corresponding to one of the plurality of packages to be formed from the panel. Many different panel sizes can be used such as for example, 3 inches by 4 inches, 2 inches by 4 inches, and 4 inches by 4 inches.

In 204 a plurality of LEDs are provided, each of which is to be mounted to a respective one of the attach pads on the substrate panel. In one embodiment, the plurality of LEDs comprise white emitting LEDs chips, and many different white chips can be used with a suitable white chip being described in the patent applications mentioned above and incorporated herein. In other embodiments more than one LED can be provided for mounting to each of the attach pads. In this step a plurality of ESD protection elements can also be provided, each of which can be mounted in conjunction with one of the attach pads to provide ESD protection for its LED package.

In 206 each of the LEDs is die attached to the one of the attach pads, and as mentioned above, many different mounting methods and materials can be used, with a suitable method being mounting using conventional solder materials and methods. In this step each of the ESD elements can also be mounted to a respective attach pad using the same mounting method and material. It is understood that the ESD element can also be mounted in other locations using other methods.

In 208 the panel undergoes a solder flux clean to remove any flux that may have accumulated during previous processing steps. In 210 wire bonds are formed on the for each of the LEDs and ESD elements electrically connecting them to the appropriate one of their respective contact pads. As described above, each of the LEDs and their accompanying ESD element can be wire bonded to the second contact pad. The wire bonds can be formed using known processes and can be made of known conductive materials such as gold.

In some embodiments the LEDs can be provided and mounted to the panel without the desired conversion material. In these embodiments the conversion material can be deposited on the LED after wire bonding. In optional 212 the conversion material or phosphor is deposited on the LED and many different known phosphor deposition methods can be used such as electophoretic deposition or EPD. Many different phosphor deposition processes can be used with a suitable EPD process described in the patent application described above.

Figure 6A:
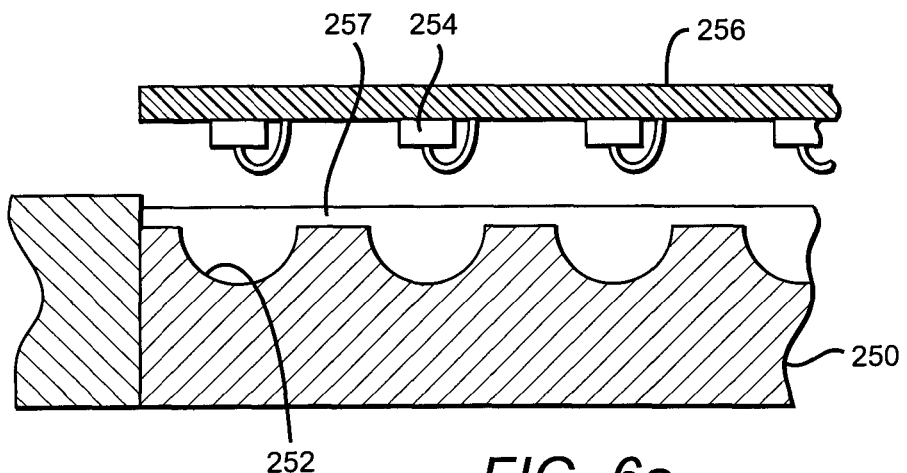
FIG. 6a is a sectional view of one embodiment of a lens mold according to the present invention.
Figure 6B:
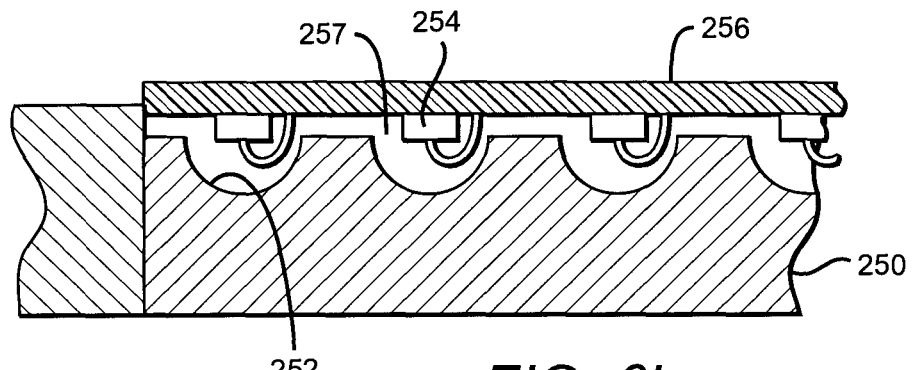

In 214 a lens is molded over each of the LEDs and many different molding methods can be used. In one embodiment a molding process is used that simultaneously forms lenses over the LEDs in the submount panel. One such molding process is referred to as compression molding processes. Referring now to FIGS. 6a and 6b one embodiment of compression molding is shown wherein a mold 250 is provided having a plurality of cavities 252 each of which has an inverted shape of the lens, wherein each cavity 252 is arranged to align with a respective one of the LEDs 254 on a substrate panel 256. The mold 250 is loaded with a lens material 257 in liquid form filling the cavities 252, with the preferred material being liquid curable silicone. Referring to 5b, the panel 256 is moved toward the cavity with each of the LEDs 254 being embedded in the liquid silicone within one a respective one of the cavities 252. In one embodiment a layer of silicone can also remain between adjacent lenses that provides a protective layer over the top surface of the submount. The liquid silicone can then be cured using known curing processes. The panel can then be removed from the mold and as shown in FIGS. 7a and 7b the panel can comprise a plurality of lenses 258, each of which is over a respective one of the LEDs 254. The individual LED packages can then be separated from the panel, such as along dashed lines shown.

Referring again to FIG. 5, in 216 the panel can then diced/singulated to separate the individual LED packages and different methods can be used such as known saw singulation methods. When using this method a tape can be attached to the panel prior to singulation to hold and stabilize the panel and individual LED packages. Following singulation, the LED packages can be cleaned and dried.

In 218 each of the LED packages can be tested to be sure they are operating correctly and to measure each device output light characteristics. It is understood that the packages can also be tested at different points in this method by probing the submount panel. In 220 the LED packages can be binned according to their output characteristics, packaged according to each bin, and shipped to the customer.

One embodiment of a method is described herein, but it is understood that different embodiments of methods according to the present invention can use the same steps in different order or can have different steps. Regarding the LED packages, the present invention has been described in detail with reference to certain preferred configurations thereof, other versions are possible. Therefore, the spirit and scope of the invention should not be limited to the versions described above.

We claim:

1. A method for fabricating a plurality of surface mount Light Emitting Diode (LED) packages, comprising:
   sizing a submount panel to accommodate formation of a plurality of LED packages;
   forming sets of attach pads and contact pads on a first surface of said submount panel, each of said sets of attach pads and contact pads corresponding to one of said LED packages formed from said submount panel;
   attaching a plurality of LEDs to said submount panel, each of said plurality of LEDs attached to an electrically connected to one of said sets of attach pads and contact pads;
   molding a plurality of hemispherical lenses on said submount panel, each hemispherical lens in said plurality of hemispherical lenses coupled to the first surface of said submount panel and coupled over one LED in said plurality of said LEDs, such that at least a portion of said hemispherical lenses is directly coupled to the first surface of said submount panel, said hemispherical lenses comprising a protective layer on and covering the first surface of said submount panel between said hemispherical lens and an edge of said submount panel;
   forming sets of surface mount contacts on the surface of said submount panel opposite said sets of attach pads and contact pads, each of said sets of said surface mount contacts corresponding to a respective one of said sets of attach pads and contact pads; and
   singulating said submount panel into a plurality of LED packages, wherein each of said plurality of said singulated LED packages comprises at least one of said attach pads and at least one of said contact pads that in combination cover at least 75% of said first surface of the portion of said submount panel in said singulated LED package.

2. The method of claim 1, further comprising forming a thermally conductive metalized layer on the surface of said submount panel.

3. The method of claim 1, further comprising and forming vias through said submount panel, said vias electrically connecting said mount contacts to said contact pads.

4. The method of claim 1, further comprising coating said LEDs with a conversion material.

5. The method of claim 1, wherein said molding process comprises compression molding.

6. The method of claim 1, wherein said singulating comprises saw singulating.

7. The method of claim 1, further comprising wire bonding said LED its respective one of said sets of attach pads and contact pads.

8. The method of claim 1, further comprising forming a plurality of thermally conductive metalized layers on the surface of said submount panel opposite said sets of attach pads and contact pads, each of said plurality of thermally conductive metalized layers corresponding to one of said sets of attach pads and contact pads.

9. The method of claim 1, further comprising forming sets of vias through said submount panel, each of said vias sets corresponding to one of said sets of attach pads and contact pads, said vias electrically connecting its corresponding contact pads to its said surface mount pads.

10. The method of claim 1, further comprising wire bonding each of said LEDs to its attach pads or contact pads.

11. The method of claim 1, further comprising texturing of a surface of said hemispheric lenses.

* * * * *